United States Patent [19]
Koizumi et al.

[11] Patent Number: 5,475,244
[45] Date of Patent: Dec. 12, 1995

[54] AN MIS TRANSISTOR HAVING A FIRST CONDUCTIVITY TYPE SOURCE AND DRAIN REGIONS OF A FIRST SEMICONDUCTOR MATERIAL SANDWICHING A CHANNEL REGION OF A SECOND CONDUCTIVITY TYPE OF A SECOND

[75] Inventors: Toru Koizumi, Yokohama; Hidemasa Mizutani, Sagamihara; Masakazu Morishita, Hiratsuka, all of Japan

[73] Assignee: Canon Kabushiki Kaisha, Tokyo, Japan

[21] Appl. No.: 37,681

[22] Filed: Mar. 24, 1993

Related U.S. Application Data

[63] Continuation of Ser. No. 784,256, Oct. 29, 1991, abandoned.

[30] Foreign Application Priority Data

Oct. 31, 1990 [JP] Japan ................... 2-292119
Oct. 31, 1990 [JP] Japan ................... 2-292121
Oct. 31, 1990 [JP] Japan ................... 2-292120
Jan. 23, 1991 [JP] Japan ................... 3-021451

[51] Int. Cl.⁶ ............... H01L 31/072; H01L 29/04; H01L 27/01; H01L 31/117
[52] U.S. Cl. ............... 257/192; 257/66; 257/347; 257/352; 257/616
[58] Field of Search ................... 357/2, 4, 15, 16, 357/23.7, 61, 63; 257/57, 66, 347, 348, 352, 353, 616, 192, 194

[56] References Cited

U.S. PATENT DOCUMENTS

| | | | |
|---|---|---|---|
| 4,673,957 | 6/1987 | Ovshinsky et al. | 357/23.7 |
| 4,727,044 | 2/1988 | Yamazaki | 437/45 |
| 5,034,788 | 7/1991 | Kerr | 357/23.7 |
| 5,036,374 | 7/1991 | Shimbo | 357/16 |
| 5,049,953 | 9/1991 | Mihara et al. | 357/15 |
| 5,142,641 | 8/1992 | Fujioka | 357/16 |

FOREIGN PATENT DOCUMENTS

| | | | |
|---|---|---|---|
| 0176409 | 4/1986 | European Pat. Off. | 357/42 |
| 59-231865 | 12/1984 | Japan | 357/23.7 |
| 60-224274 | 11/1985 | Japan | 357/23.7 |
| 61-56460 | 3/1986 | Japan | 357/23.7 |
| 62-131573 | 6/1987 | Japan | 357/23.7 |
| 1-248668 | 10/1989 | Japan | 357/23.7 |
| 1-276765 | 11/1989 | Japan | 357/23.7 |
| 3-62972 | 3/1991 | Japan | 357/23.7 |
| 3-119764 | 5/1991 | Japan | 257/349 |

OTHER PUBLICATIONS

IBM Technical Disclosure Bulletin, vol. 33, No. 4 Sep. 1990, p. 411–413 Pat. Abs. of Japan, vol. 014–133, No. 02001178.

Primary Examiner—Steven R. Loke
Attorney, Agent, or Firm—Fitzpatrick, Cella, Harper & Scinto

[57] ABSTRACT

An MIS transistor has a channel portion of a first conduction type of first semiconductor material formed on an insulating substrate, second conduction type source and drain regions sandwiching said channel portion therebetween, and a gate electrode formed on a main surface of the channel portion with an insulating film therebetween, wherein the source region is made of the first semiconductor material and a second semiconductor material having an energy band gap smaller than that of the first semiconductor material and a heterojunction between the first and second semiconductor materials is provided outside of a depletion layer region formed in the junction between the source and channel portions, and inside a diffusion length $L_d$ from a depletion edge.

11 Claims, 32 Drawing Sheets

ELECTRODE (HETERO JUNCTION FACE) POSITION FROM DEPLETION LAYER EDGE (W)

HETERO JUNCTION

PN JUNCTION OF SOURCE CHANNEL

FERMI LEVEL 1203-6  1203-8

HETERO JUNCTION FACE  PN JUNCTION FACE OF SOURCE CHANNEL

AN MIS TRANSISTOR HAVING A FIRST CONDUCTIVITY TYPE SOURCE AND DRAIN REGIONS OF A FIRST SEMICONDUCTOR MATERIAL SANDWICHING A CHANNEL REGION OF A SECOND CONDUCTIVITY TYPE OF A SECOND

This application is a continuation of application Ser. No. 07/784,256, filed Oct. 29, 1991, now abandoned.

BACKGROUND OF THE INVENTION

1. Field of the Invention

The present invention relates to an MIS (Metal Oxide Insulator) transistor having an MIS structure in which an insulating film and a metal electrode are formed on the surface of a semiconductor.

2. Related Background Art

MIS field effect transistors formed on thin film insulating substrates have recently attracted attention as high-speed semiconductor devices. The structure of such MIS semiconductor devices is basically the same as that of an MIS field effect transistor formed on a bulk substrate. FIG. 1A is a schematic sectional view showing an example of such MIS field effect transistors. In FIG. 1A, reference numeral 151 denotes a ground silicon oxide film; reference numeral 152, a semiconductor layer; reference numeral 153, a thermal oxidation film; reference numeral 154, a polycrystalline silicon film; reference numeral 156, a sulfur nitride glass layer; reference numeral 157, an interlayer insualting film; reference numeral 158, wiring electrodes; and reference numeral 159, a protective film. FIG. 1B is a drawing showing the energy band of the MIS field effect transistor shown in FIG. 1A in the channel direction in thermal equilibrium, and FIG. 1C is a drawing showing the energy band of the same transistor when a drain voltage is applied thereto. In this MIS field effect transistor, the source and drain portions are doped with boron, phosphorous or arsenic. As shown in FIG. 1B, the energy band gap $Eg_1$ of the source and drain portions is the same as the energy band gap $Eg_2$ of the channel portion.

As described above, since the MIS field effect transistor has the channel portion comprising the thin film semiconductor layer formed on the insulating substrate, non-transport carriers (holes in the case of N-MOS) which are produced by impact ionization at the drain edge are accumulated in the channel portion. As a result, the electrode potential in the channel portion is decreased, thereby causing the problem that a kink phenomenon occurs, and the source-drain endurance voltage is decreased. Namely, since the energy band gap $Eg_1$ of the source and drain portions is equal to the energy band gap $Eg_2$ of the channel portion, charge is concentrated at the drain edge, and many parts of electrons 113 and holes 114 are thus produced by the impact ionization, as shown in FIG. 1C. Although the electrons 113 produced are discharged to the drain electrode 112, the holes 114 flow in the channel portion 115. In MOS transistors comprising a thin film silicon oxide substrate, an electrode for fixing the potential of the substrate is sometimes not provided in order to obtain the thin film effect of improving the mobility or the like. In this case, the holes are inhibited from flowing in the source by the potential wall and accumulated in the channel portion without being discharged, resulting in a decrease in the electron potential, as shown in FIG. 1C. The steady state is thus maintained by decreasing the height of the potential barrier between the source and channel portions to a value smaller than the intrinsic height so as to partially discharge the holes. This state corresponds to the state wherein a positive voltage is applied to the substrate, i.e., the state wherein the Vth value is shifted to the negative direction in a N-MOS transistor. This is generally called "substrate floating effect". This phenomenon becomes significant when a drain voltage is applied and causes the fault that the drain current Id is abruptly increased when the drain voltage is increased to a certain value, as shown in FIG. 2. For example, in a field effect transistor having a gate length of 1 μm, the drain current is abruptly increased at a drain voltage of about 5 volt. Even if a substrate electrode is provided for removing this fault, since the semiconductor layer has a very small thickness and a low efficiency of hole discharge, although the endurance voltage between the source and drain is slightly increased, the above problem is not solved.

An LDD (Light Doped-Drain) structure is employed as a measure to solve the above problem. However, this structure is designed for relieving the electrical field at the drain edge so as to inhibit electron-hole pairs from being generated by the impact ionization. Since most current measures to solve the problems are designed for relieving the electrical field at the drain edge, conventional structures for relieving the electrical field including the LDD structure and the like slightly increased the endurance voltage between the source and drain by about 2 volt.

SUMMARY OF THE INVENTION

The present invention has been achieved for solving the above problem, and it is an object of the invention to provide an MIS field effect transistor which is capable of effectively controlled the phenomenon of inhibiting the discharge of holes, which is due to the above causes, and maintaining a sufficient source-drain endurance voltage.

It is another object of the present invention to provide an MIS transistor which is capable of removing a kink phenomenon and improving the source-drain endurance voltage and which can be operated at a high speed with a sufficiently low dark current.

DETAILED DESCRIPTION OF THE PREFERRED EMBODIMENTS

Figure 1A:
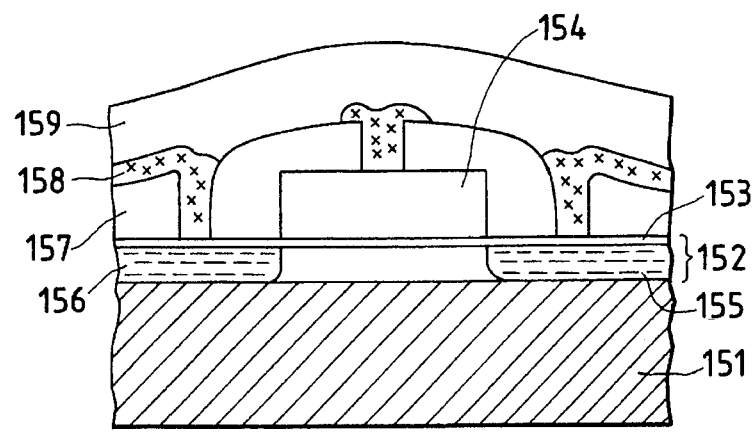
FIG. 1A is a schematic sectional view showing a conventional MIS field effect transistor.

The inventors investigated the mechanism of producing the above-mentioned faults in an MIS field effect transistor. As a result, the inventors found that the potential barrier to movement of holes between source and channel portions can be decreased by using materials having different band gaps for the source and channel portions. This finding lead to the achievement of the present invention.

In order to achieve the objects, the present invention provides an MIS field effect transistor comprising a first conductivity type semiconductor layer having a channel portion, a second conductivity type impurity region which forms opposite source and drain portions with the channel portion therebetween, and a gate electrode provided on the channel portion with a gate insulating film therebetween, wherein the channel and source portions respectively comprises semiconductors having different energy gaps.

In order to achieve the objects, the present invention is characterized by the following:

(1) The PN junction between the source and the channel portions is a homojunction, and a heterojunction is provided outside the depletion layer region of the PN junction and inside the diffusion length Ld from the depletion layer region edge.

(2) The heterojunction is made of the same first semiconductor material as that of the channel region and the second semiconductor material which forms the source region, and the energy band gap of the second semiconductor material is narrower than that of the first semiconductor material.

The feature (1) includes the following preferred forms:

(1)-1 ... A heterojunction is separated from a source-channel PN junction and present in the source region.

(1)-2 ... The distance between a heterojunction and a PN junction is equal to the diffusion length $L_d$ (this is because the depletion layer edge is substantially considered as the PN junction since the width of the depletion layer can be substantially neglected in a high-concentration impurity region such as the source and drain regions or the like).

In another preferred form of the invention, a thin film MIS transistor comprises a channel portion formed on an insulating substrate and comprising a first conductivity type semiconductor, source and drain portions formed with the channel portion therebetween and comprising a second conductivity type semiconductor, and a gate electrode formed oh the main surface of the channel portion with an insulating film therebetween, wherein at least the source portion contains a heterojunction and, as the second conductivity type semiconductor a mixed crystal ($Si_xGe_{1-x}$) region containing silicon with a mixed crystal rate x and germanium, and the channel portion contains, as the second conductivity type semiconductor, a mixed crystal ($Si_yGe_{1-y}$) region containing silicon with a mixed crystal rate of y and germanium, the mixed crystal rates x and y satisfying the conditions that x<y and x≦0.12.

It is also preferable that a heterojunction is not included in the depletion layer formed in a PN junction portion and is provided inside the diffusion length $L_d$ from the depletion edge of the PN junction.

In a further preferred form of the invention, a metal electrode of the source portion is provided outside the depletion layer region of the PN junction between the source and channel portions and inside the diffusion length $L_d$ from the depletion edge on the source side, and the metal electrode is extended to the ground insulating substrate. Namely, the present invention provides an MIS transistor which has improved resistance to the kink phenomenon, an increased source-drain endurance voltage, which comprises the source and drain regions with sufficiently low parasitic resistance and which can be operated at high speed.

As described above, there are demands for increasing the operating speed such as the switching speed of a semiconductor device and the degree of integration thereof. The micronization of the device accelerates increases in the operating speed and the degree of integration and reaches the submicron order. However, the micronization is limited by a problem with respect to the short channel effect or the like.

The thin film SOI transistor is investigated as a transistor having short channel resistance for inhibiting the short channel effect. Since the thin film SOI transistor has the effect of inhibiting the short channel effect and the effects of improving the mobility at the boundary between the gate and the insulating film by relieving the vertical electrical field, decreasing the junction capacity between the source and drain portions and decreasing dark current, the SOI transistor permits further increases in the operating speed and the quality.

However, thinning of the transistor accelerates the kink phenomenon that non-transport carriers (in the case of a N-type MOS transistor, holes) among the electron-hole pairs produced by impact ionization at the drain edge and the deterioration in the source-drain endurance voltage. This is a critical problem of the thin film SOI transistor.

While the MIS transistor containing heterojunctions and the source and drain portions made of a semiconductor material having a energy band gap narrower than that of a semiconductor material used for the channel portion does not have the above problem.

Figure 3A:
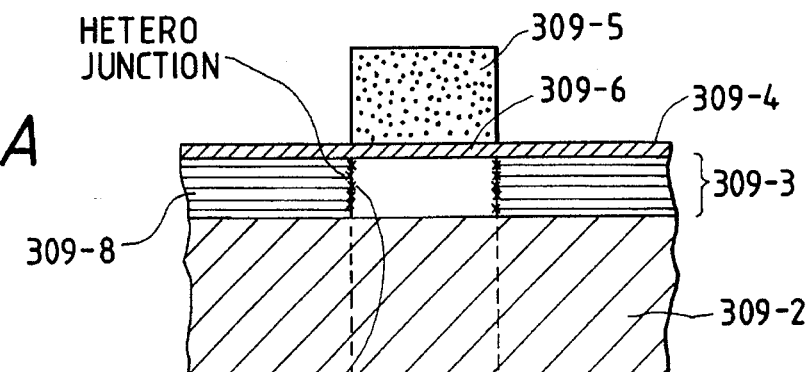
FIGS. 3A to 3C are drawings for respectively explaining the sectional structure of a thin film SOI-MIS transistor containing heterojunctions, the energy band and the energy band between the source and channel.
Figure 3B:
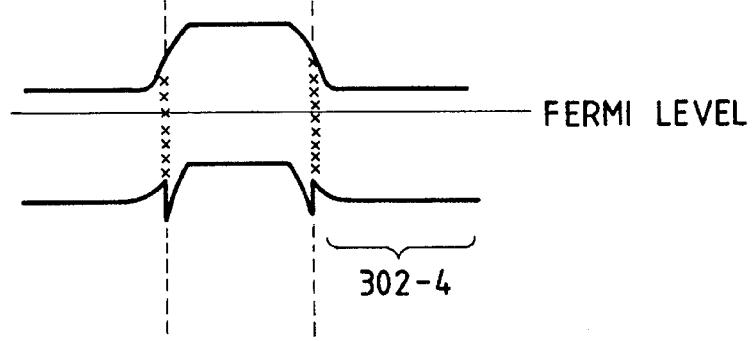
Figure 3C:
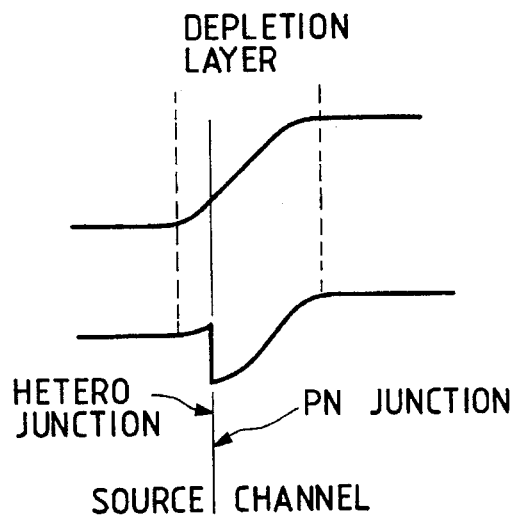

FIG. 3A schematically shows the sectional structure of an example of thin film SOI-MIS transistors containing heterojunctions, and FIGS. 3B and 3C show the energy band thereof.

FIG. 3C is a partially enlarged view for explaining the energy band shown in FIG. 3B.

In FIG. 3A, reference numeral 309-2 denotes a ground insulating layer ($SiO_2$); reference numeral 309-3, a semiconductor active layer (Si); reference numeral 309-4, a gate insulating layer; reference numeral 309-6, a channel portion made of a first semiconductor material; reference numeral 309-8, source and drain regions made of a second semiconductor material; and reference numeral 309-5, a gate electrode.

As shown in FIGS. 3A to 3C, the energy barrier of non-transport carriers is lowered without changing the energy barrier of transport carriers so that the PN junction (heterojunction) between the source and channel portions facilitates the flow of the non-transport carriers in the source region.

As a result, no non-transport carrier is accumulated in the channel portion, thereby removing the kink phenomenon and increasing the source-drain endurance voltage.

In a typical example of such transistors, silicon (Si) is used as a semiconductor material for the channel portion and a mixed crystal ($Si_xGe_{1-x}$) containing silicon and germanium is used as a semiconductor material for the source portion.

Figure 4:
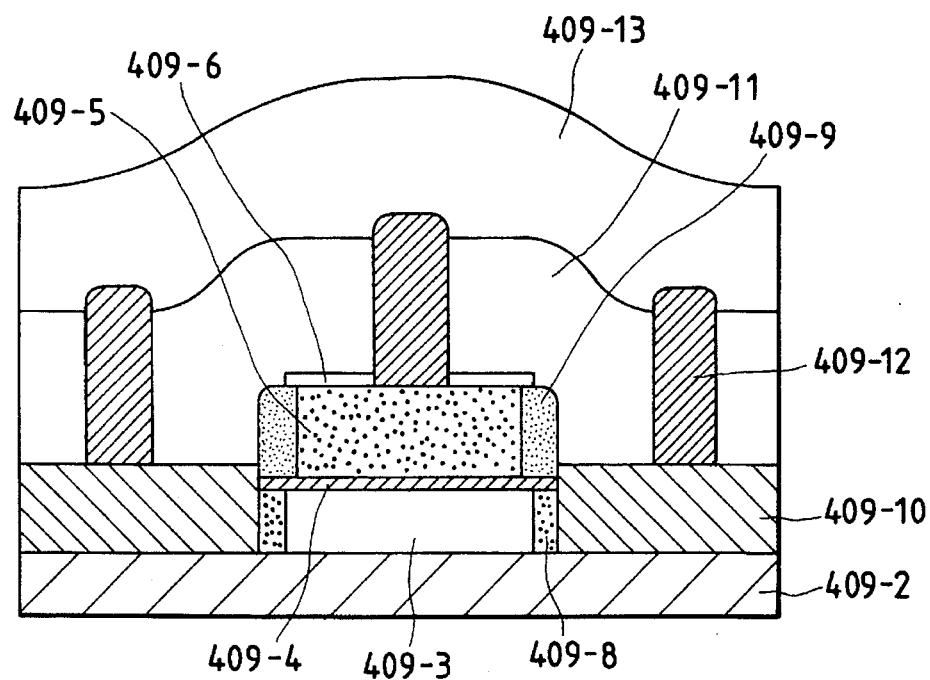
FIG. 4 is a sectional view showing the structure of an SOI-MIS transistor containing heterojunctions.

FIG. 4 is a schematic sectional view showing the structure of such a thin film SOI-MIS field effect transistor containing heterojunctions.

In the drawing, reference numeral 409-2 denotes a ground insulating film ($SiO_2$); reference numeral 409-3, a semiconductor active layer (Si) which forms a channel portion; reference numeral 409-4, a gate insulating layer; reference numeral 409-5, a gate electrode; reference numeral 409-6, a silicon nitride mask film; reference numeral 409-8, source and drain regions consisting of silicon (Si); reference numeral 409-9, a polycrystalline silicon oxide film (spacer); reference numeral 409-10, source and drain regions consisting of $Si_xGe_{1-x}$; reference numeral 409-11, an interlayer insulating film (PSG); reference numeral 409-12, alumina; and reference numeral 409-13, a protective film (PSG).

Si of the source and drain regions 409-8 and the mixed crystal $Si_xGe_{1-x}$ of the source and drain regions 409-10 form heterojunctions.

The mixed crystal rate x of the mixed crystal $Si_xGe_{1-x}$ is about 0.8 which is sufficient for improving the resistance to the kink phenomenon and the source-drain endurance voltage.

If the semiconductor active layer (Si) which forms the channel portion 409-3 is considered as a mixed crystal ($Si_yGe_{1-y}$) with a mixed crystal rate y of 1, since the x value is about 0.8, the relation, $x<y$, is established.

However, as described above, in the MIS transistor containing heterojunctions, the PN junctions between the source and channel portions are heterojunctions between the first semiconductor material and the second semiconductor material.

Since such heterojunction interfaces have many defects, as compared with homojunctions, if the PN junction portions between the source and channel portions are heterojunction portions, or if the heterojunction portions are contained in the depletion layers of the PN junction portions, a current is generated due to the defects serving as generation sources or serving as paths (for example, hopping current). This sometimes causes the problem that the dark current of the MIS transistor is increased.

In addition, a thin film SOI transistor sometimes produces the problem that thinning of the semiconductor layer and the submicronization of the gate make the parasitic resistance component of the source and drain regions significant, as compared with on resistance, thereby deteriorating the driving force of the transistor.

Further, in the above-mentioned MIS transistor containing the Si:$Si_xGe_{1-x}$ heterojunctions, since the carrier mobility in $Si_xGe_{1-x}$ is decreased a problem is sometime produced due to the high parasitic resistance of the source and drain regions.

Namely, since the resistance is significantly increased by the thinning of the semiconductor layer and the formation of the source and drain regions made of a mixed crystal, and the parasitic resistance component of the source and drain regions relatively significantly increased by a decrease in the channel length of the MIS device, the parasitic resistance is substantially equal to or higher than the on resistance of the channel. This sometimes causes the problem that the driving force Gm deteriorates to about ½ of the original force.

Figure 5A:
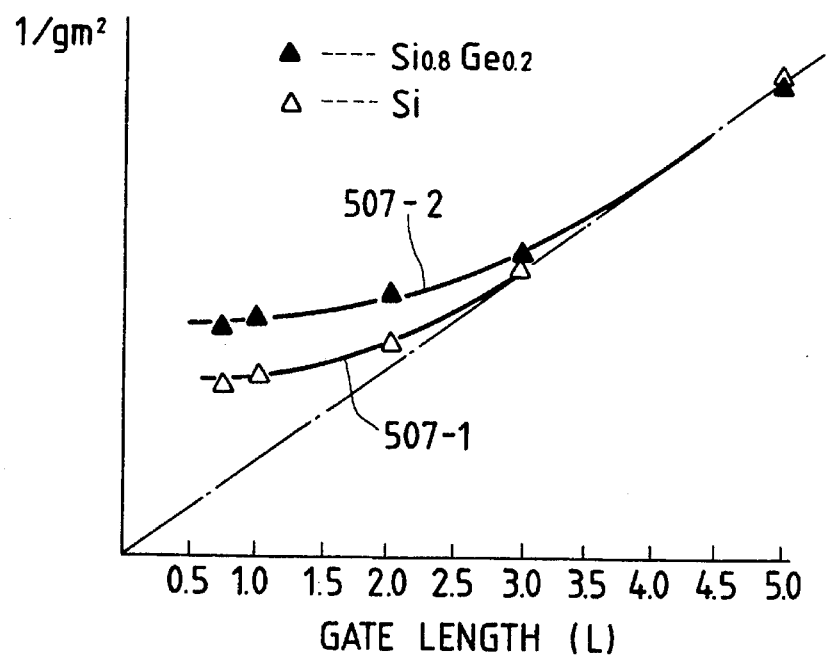
FIGS. 5A and 5B are graphs respectively showing the dependency of the driving force (Gm) of a thin film SOI-MIS transistor on the gate length (L) and the Id-Vg characteristics thereof.

FIG. 5A shows the relation between the driving force Gm and the gate length L, which relation is obtained by extrapolation using an MIS transistor 507-1 consisting of Si and an MIS transistor 507-2 containing heterojunctions of Si:Si$_{0.8}$Ge$_{0.2}$ with a mixed crystal rate x of 0.8. As shown in the drawing, since the driving force Gm depends upon only the on resistance of a transistor because the parasitic resistance is intrinsically negligible, the dependency on the gate length (L) is shown by a straight line (ideal line) passing through the origin shown in the drawing. However, the dependency on the gate length (L) of both the above MIS transistors 507-1 and 507-2 is significantly deviated from the ideal line due to the deterioration in the driving force Gm. Namely, both the transistors 507-1 and 507-2 show the deterioration in the driving force Gm, which is due to a relative increase in the parasitic resistance component caused by a decrease in the channel length. This shows that the excellent properties of a MIS transistor containing heterojunctions are sometimes insufficiently exhibited in view of some properties.

Figure 5B:
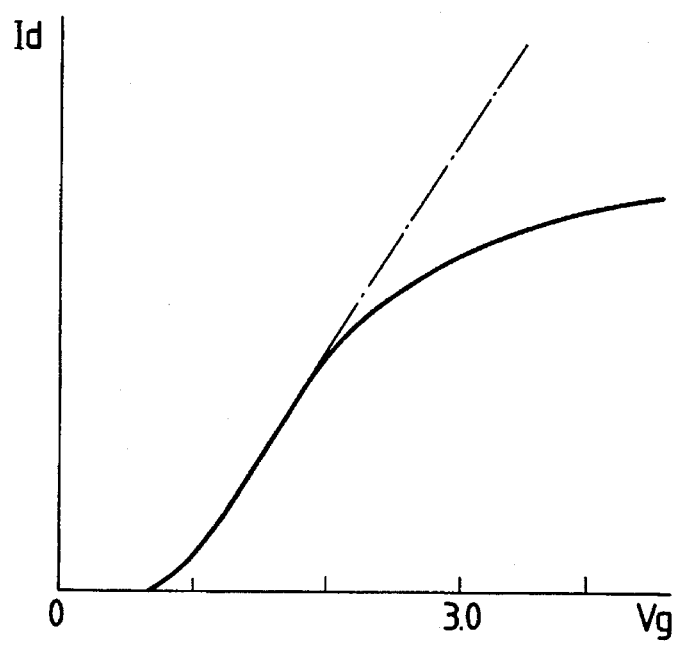

FIG. 5B shows the Id-Vg characteristics of the triode region of a transistor formed by using Si. In the drawing, the linearity is significantly deteriorated by an increase in the parasitic resistance component of the source and drain regions, as the Vg value is increased.

This relative increase in the parasitic resistance of the source and drain regions, which is caused by a decrease in the channel length, is also a problem of a bulk silicon transistor. However, an MIS transistor formed on a thin film SOI substrate sometimes produces a problem for the following causes:

(1) If the thickness of the semiconductor layer is 500 Å or less, it is difficult to inject a high concentration of impurities in the layer by ion implantation.

(2) Since the ground comprises an amorphous insulating substrate, it is difficult to recover the crystallinity loss, which is caused by ion implantation in the source and drain regions.

Namely, when an attempt is made to further improve the properties of the source and drain regions of an SOI-MIS transistor, problems to be solved are further produced.

As described above, an MIS transistor having heterojucntions has the tendency that if the PN junction between the source and channel portions is provided in the same region as that of the heterojunction, the dark current of the PN junction is increased due to the presence of many defects serving as recombination centers in the heterojunction face.

If the problem about the dark current is neglected, when the PN junction between the source and channel portions is the heterojunction, the source-drain endurance voltage is most effectively increased due to the lowest energy barrier between the source and channel.

Figure 6:
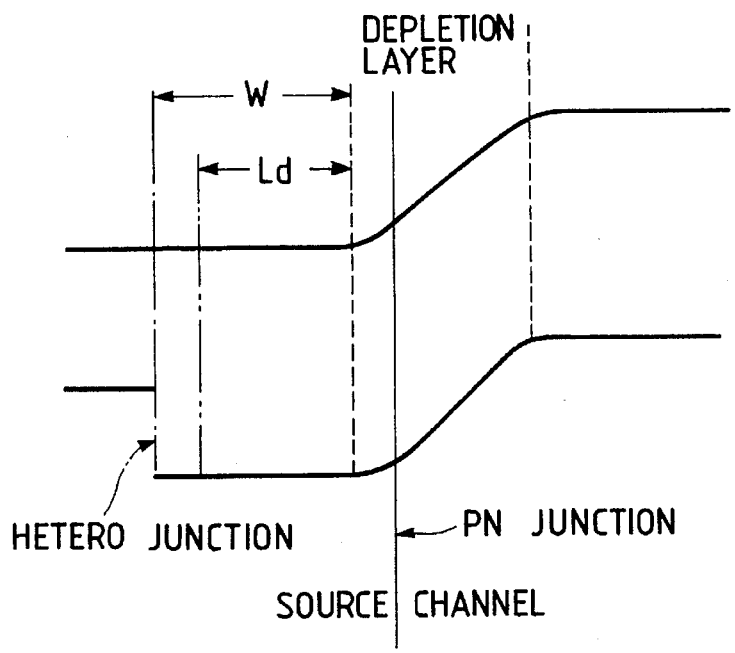
FIG. 6 is a drawing the energy band of a thin film SOI transistor in which a heterojunction is sufficiently separated from the depletion edge of the source/channel junction.

On the other hand, as shown in the energy band in FIG. 6, when a heterojunction face is simply separated from a PN junction face, the ability to discharge non-transport carriers is the same as that of a thin film SOI-MIS transistor having a homojunction. Thus the heterojunction becomes meaningless, and the source-drain endurance voltage is the same as that of a conventional thin film SOI-MIS transistor.

Figure 13:
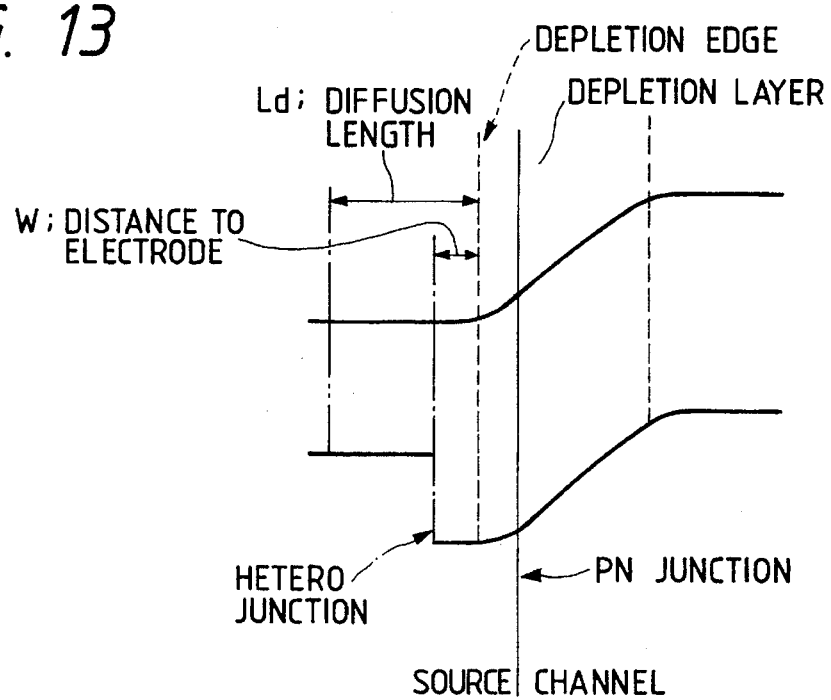
FIG. 13 is a drawing for explaining the energy band of a thin film SOI transistor of the present invention.

However, even if the PN junction between the source and channel is separated from a heterojunction, when "the distance between the heterojunction and the PN junction (depletion edge) between the source and channel" is less than the diffusion length L$_d$, the source-drain endurance voltage is effectively increased (refer to FIG. 13).

The minority carrier (holes in an n-type semiconductor or electrons in p-type semiconductor) injection forward current J at the PN junction is generally a diffusion current and is expressed by the following equation:

$$J=(qD/L_d)n_o(exp[\theta V]-1) \cdot coth(W/L_d) \qquad (a)$$

n$_o$: minority carrier concentration in thermal equilibrium
V: applied voltage
L$_d$: diffusion length
W: distance from depletion edge to electrode
D: diffusion constant
q: charge elementary quantity
θ: q/kT In this case, the position W satisfies the boundary condition that n (W)=n$_o$.

The minority carrier current (holes in NMOS) injected in the source region of a thin film SOI transistor is also expressed by the same equation as the equation (a).

For example, considering tan NMOS thin film SOI transistor, it is necessary for improving the resistance to the kink phenomenon and the source-drain endurance voltage to increase the injection of holes into the source from the channel without changing the amount of the electrons injected into the channel region.

Figure 7:
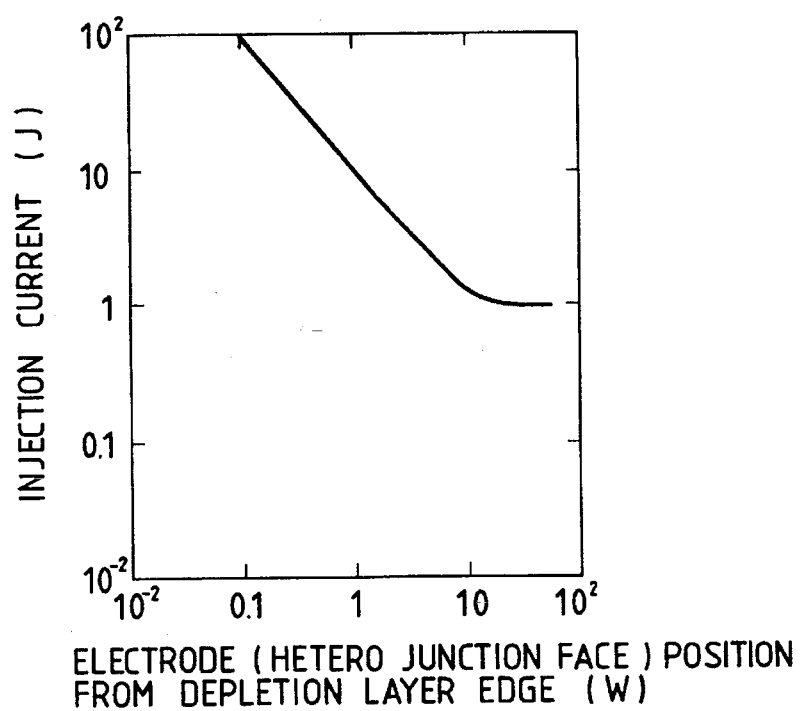
FIG. 7 is a graph showing a relation between the minority carrier injection current J and the ideal electrode W.

FIG. 7 shows of the dependency of the injection current J on the electrode position W when n$_o$(exp(θV)-1) is considered as a constant, and the diffusion length L$_d$ μm is 10 (considered as a relative value without any unit for general consideration).

In the drawing, the injection current is abruptly increased from a turn at W=10.

A semiconductor material having an energy band gap narrower than that of the semiconductor material in the channel portion is thus used for a region which satisfies the boundary condition, n(W)=n$_o$, in the source region, and the heterojunction position W is placed within the diffusion length L$_d$ from the depletion edge of the source-channel junction portion, whereby the above problems are resolved (refer to FIG. 13).

Figure 8:
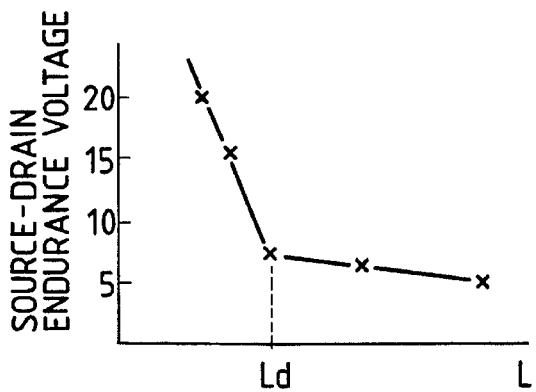
FIG. 8 is a graph showing a relation between the source-drain endurance voltage and the distance between the depletion edge of a PN junction and a heterojunction, which distance is defined by the diffusion length $L_d$ (the thickness of a Si layer is 1000 Å)

FIG. 8 is a drawing showing the relation between "the distance between the heterojunction and the source-channel junction" and "the source-drain endurance voltage".

As shown in the drawing, the property of the endurance voltage is increased when the distance is smaller than the diffusion length L$_d$.

Namely, a region (the second semiconductor material) with a high recombination speed is provided inside the diffusion length L$_d$ without hindering the flow of transport carriers (electrons in a NMOS transistor), thereby improving the ability to discharge non-transport carriers from the channel region.

Figure 9:
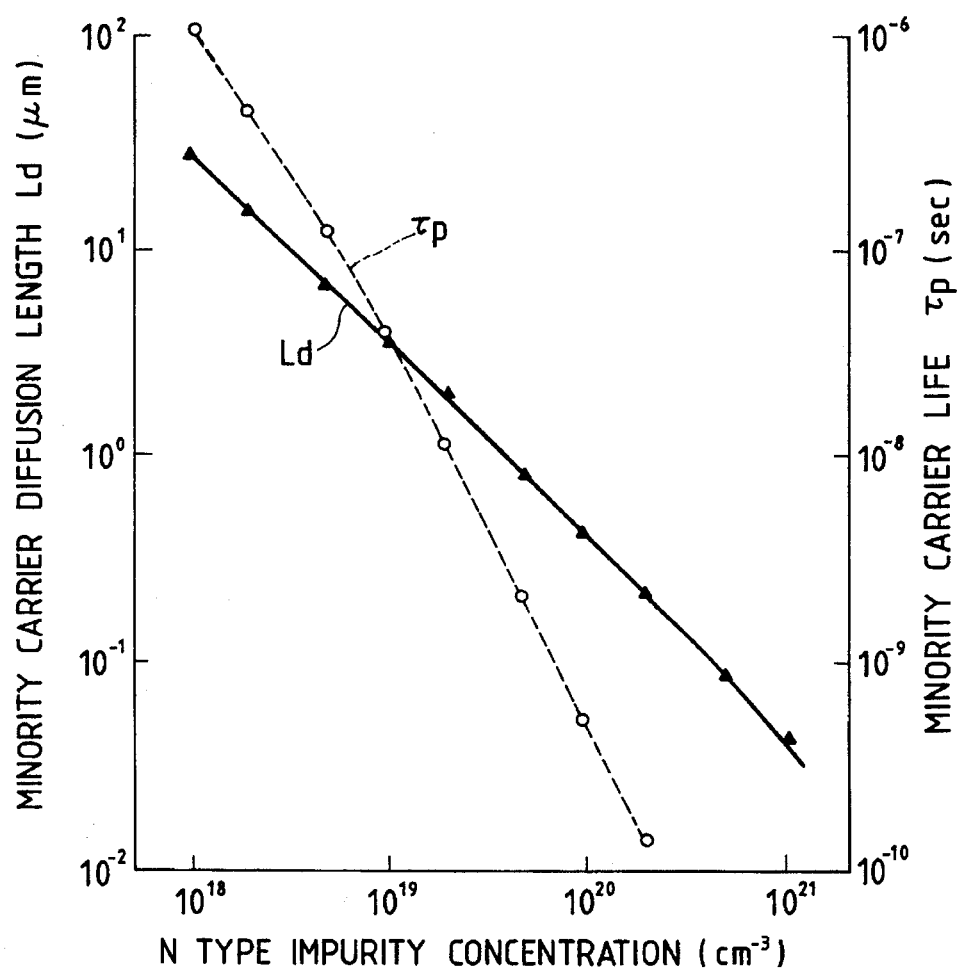
FIG. 9 is a graph showing a relation of the impurity concentration N to the diffusion length $L_d$ and the lifetime τ.

FIG. 9 is a graph showing the relations of the impurity concentration N to the diffusion length L$_d$ and the life time τ. As seen from the drawing, the diffusion length of the source and drain regions is about 1 μm because the impurity concentration of the source and drain regions is generally about $10^{19}$ to $10^{20}$ cm$^{-3}$.

The above-described heterojunction is described below. For example, in the case of an Si—Ge type semiconductor, Si can be used as the first semiconductor material, and SiGe having an energy gap smaller than that of Si can be used as the second semiconductor material.

It is preferable for decreasing the energy band gap that the ratio of Ge/Si is at least 1%.

Such a material is not limited to the Si—Ge type, and in a GaAsSb type, GaAs$_{1-x}$Sb$_x$ can be used as the first semiconductor material, and a compound semiconductor such as GaAs$_{1-y}$Sb (wherein x<y) can be used. Other types of semiconductors such as an InPAs type can also be used.

In this case, for example, if the conductivity type of the source region is N, the energy band of the second semiconductor material preferably has a conduction band with an energy edge substantially equal to that of the first semiconductor material, and a valence band with an energy edge (electron energy) higher than that of the first semiconductor material. This is because the holes accumulated in the channel portion can be discharged without inhibiting the flow of the electrons in the source region.

In addition, in an SOI-MIS transistor in which an SiGe type material is used as a semiconductor material, at least the source portion in the source and drain regions contains a heterojunction of $Si_yGe_{1-y}$:$Si_xGe_{1-x}$ (shown by reference numerals 1001-8:1001-10 in FIG. 10 in which reference numeral 1001-8 shows as an example Si with a mixed crystal rate y of 1), and the channel portion is also made of $Si_yGe_{1-y}$ with a different mixed crystal rate y, the mixed crystal rate y of the channel portion is greater than the mixed crystal rate x of the source portion, and the mixed crystal rate x of the mixed crystal $Si_xGe_{1-x}$ in the source and drain regions is 0.12 or less. This enables the formation of a high-speed thin film SOI-MIS transistor having the following properties:

(1) The source and drain regions has a low resistance.

(2) The driving force Gm is not deteriorated by the parasitic resistance of the source and drain regions.

In the present invention, the mixed crystal rate x of the mixed crystal $Si_xGe_{1-x}$ at least in the source portion is 0.12 or less so that the source and drain regions has a low resistance. The reasons for this are described below.

The mobility $\mu$ of a mixed crystal is expressed by the following equation:

$$(\mu)^{-1}=(\mu_i)^{-1}+(\mu_a)^{-1}+(\mu_l)^{-1}$$

$\mu_i$: mobility based on impurity diffusion
$\mu_a$: mobility based on alloy
$\mu_l$: mobility based on lattice diffusion When the mixed crystal rate x is close to zero or 1, the mobility $\mu$ is determined by the lattice diffusion, and is a value near $\mu_l$ (Ge or Si). When the mixed crystal rate is about 0.5, the mobility is dominated by the mobility $\mu_a$ by an alloy. The value of $\mu_a$ is as low as 300 to 400 cm$^2$/v.s.

Figure 11:
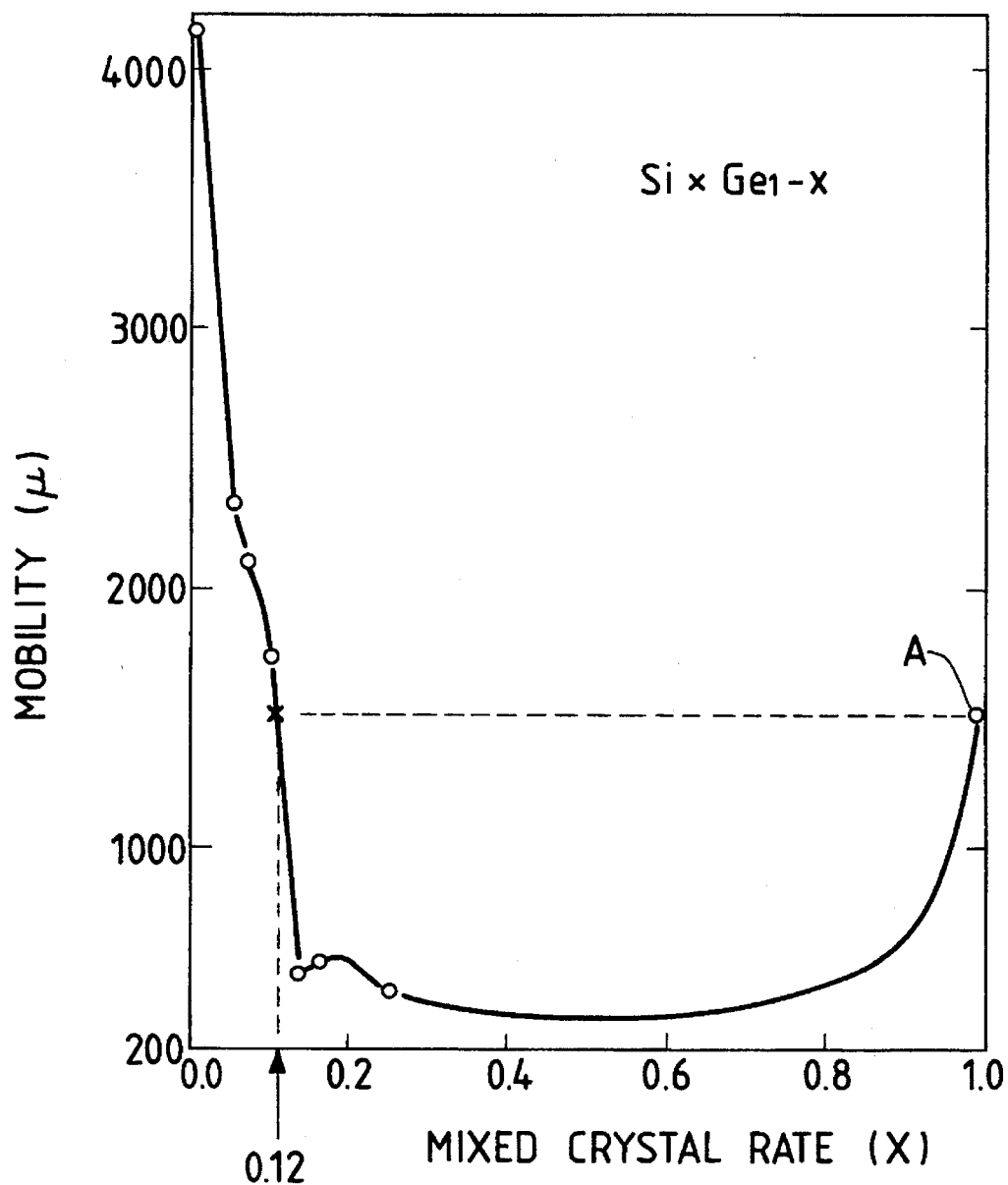
FIG. 11 is a drawing showing a relation between the mixed crystal rate X and the mobility μ in a mixed crystal $Si_xGe_{1-x}$.

FIG. 11 is a graph showing the relation between the mobility $\mu$ and the mixed crystal rate x. In a conventional MIS transistor containing $Si_xGe_{1-x}$, the mobility $\mu$ is as low as about 400 cm$^2$/v.s at x=0.2.

As seen from the graph, the mobility $\mu$ of $Si_xGe_{1-x}$ exceeds that (point A at x=1.0 shown in the drawing) of silicon (Si) when the mixed crystal rate x is 0.12 of less. The use of the region with a mixed crystal rate x of 0.12 or less thus permits an attempt to be made to decrease the resistance of the source and drain regions. In addition, since the melting point also decreases with an increase in the Ge ratio, this region is useful from the viewpoint of recovery of the damage produced by ion implantation.

The MIS transistor has a structure in which the distance between the heterojunction face of at least the source portion in the source and drain regions and the PN junction portion between the source and channel at the depletion edge on the source side is within the diffusion length Ld of non-transport carriers so that the accumulation of the non-transport carriers can be decreased, and the endurance voltage between the source and drain can be further increased (20 V or more).

When the resistance to the kink phenomenon and the source-drain endurance voltage of the MIS transistor comprising the source portion made of the mixed crystal $Si_xGe_{1-x}$ with a mixed crystal rate x of 0.12 or less are further improved, for example, in the case of a NMOS thin film SOI transistor, it is necessary to increase only the injection of holes into the source from the channel.

As shown in FIG. 7 showing the dependency of the injection current J on the electrode position (heterojunction position) W when the diffusion length $L_d$ is 10, the injection current J abruptly increases from a turn at W=10 (considered as a relative value without any unit for making general consideration). It is therefore preferable that a semiconductor material ($Si_xGe_{1-x}$) (denoted by reference numeral 1001-10 in FIG. 10) having an energy band gap smaller than that of the semiconductor material (Si) forming the channel portion is provided as a region satisfying the boundary condition, n(W)=$n_o$, in the source portion of a thin film containing a heterojunction, and that the heterojunction position W is placed inside the diffusion length $L_d$ from the depletion edge of the source-channel junction.

In the thin film SOI-MIS transistor, for example, in the case of a N-type MOS transistor, the kink phenomenon or deterioration in the source-drain endurance voltage is produced due to an increase in the substrate potential, which is caused by the accumulation, in the channel portion, of the holes serving as non-transport carriers among the electron-hole pairs generated at the drain edge by the impact ionization. Namely, an increase in the substrate potential lowers the potential barrier between the source and channel and thus causes the flow of a large quantity of current into the drain from the source. It is thus effective to cause the holes to efficiently flow in the source electrode, without lowering the potential barrier, i.e., while maintaining the good operation of the MOS transistor.

As described above, for example, when a NMOS thin film SOI transistor is considered, it is therefore necessary for improving the resistance to the kink phenomenon and the source-drain endurance voltage that only the injection of the holes into the source from the channel is increased for the good operation of the MOS transistor, without changing the amount of the electrons injected into the channel region.

It is therefore possible to apparently decrease the life time of the holes in the source region and increase the recombination speed by providing a metal electrode near the PN junction face.

On the basis of this thinking, the region satisfying the boundary condition, n(W)=$n_o$, i.e., the metal electrode W serving as a source, is provided within the diffusion length $L_d$ from the depletion edge of the source-channel junction so that the holes can be efficiently discharged to the source electrode, without changing the potential barrier.

Figure 23A:
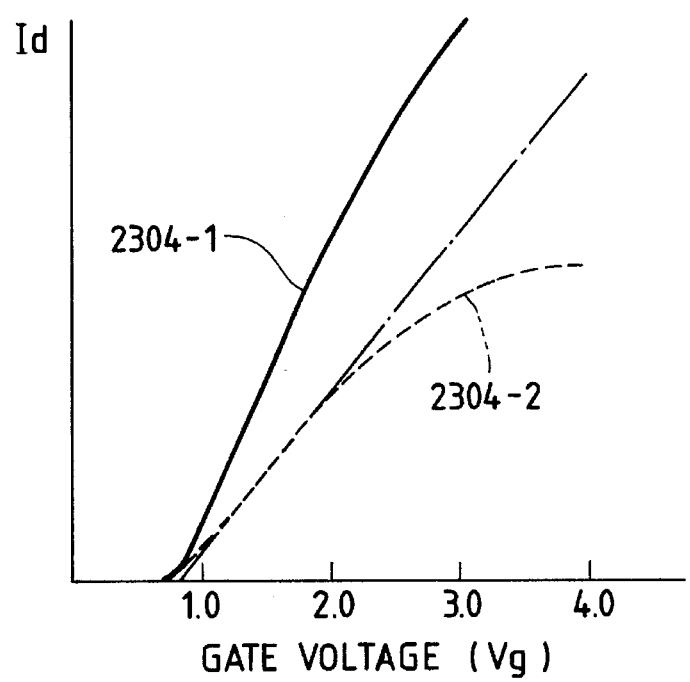
FIGS. 23A to 23D are drawings for respectively explaining the Id-Vd characteristics, the dependency of driving force on the gate length, the Id-Vd characteristics, and a relation between the contact distance and the source-drain endurance voltage.
Figure 23B:
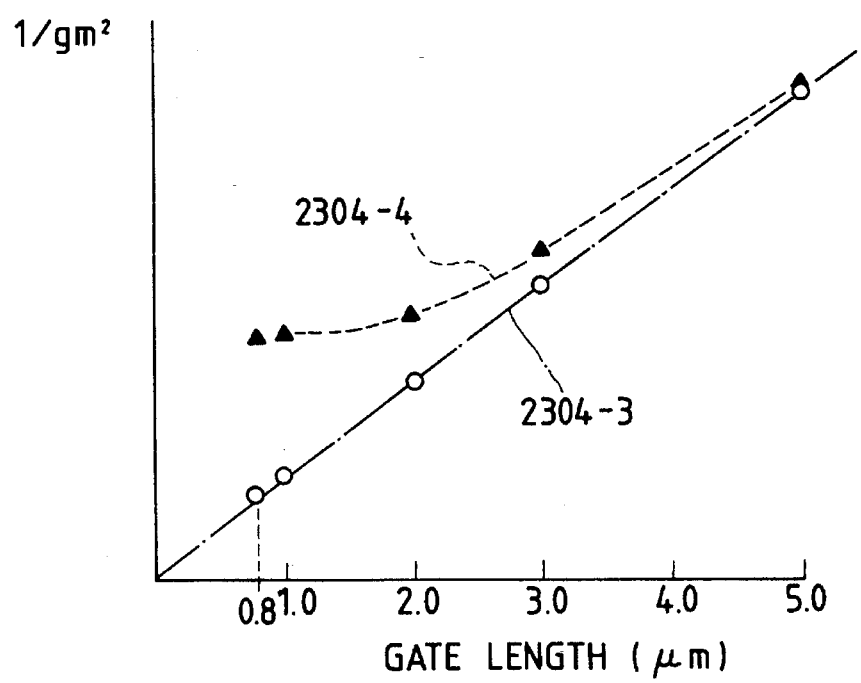
Figure 23C:
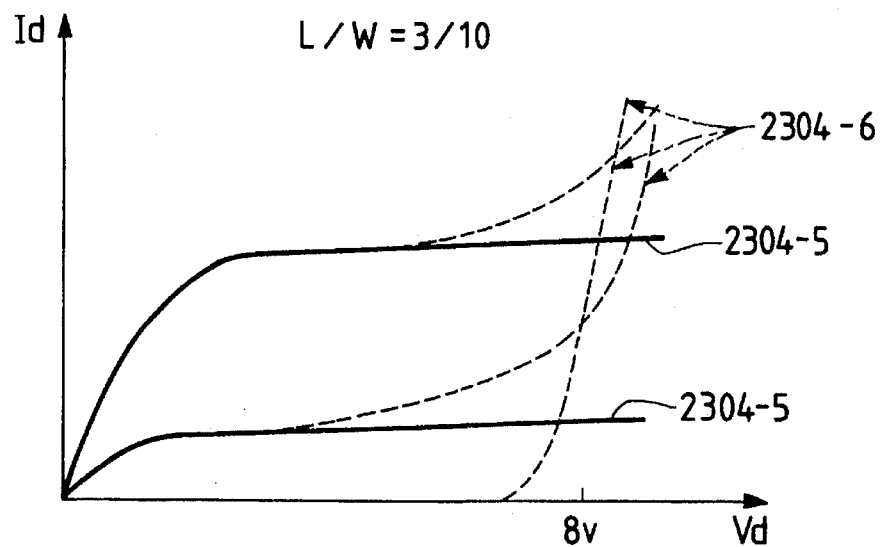
Figure 23D:
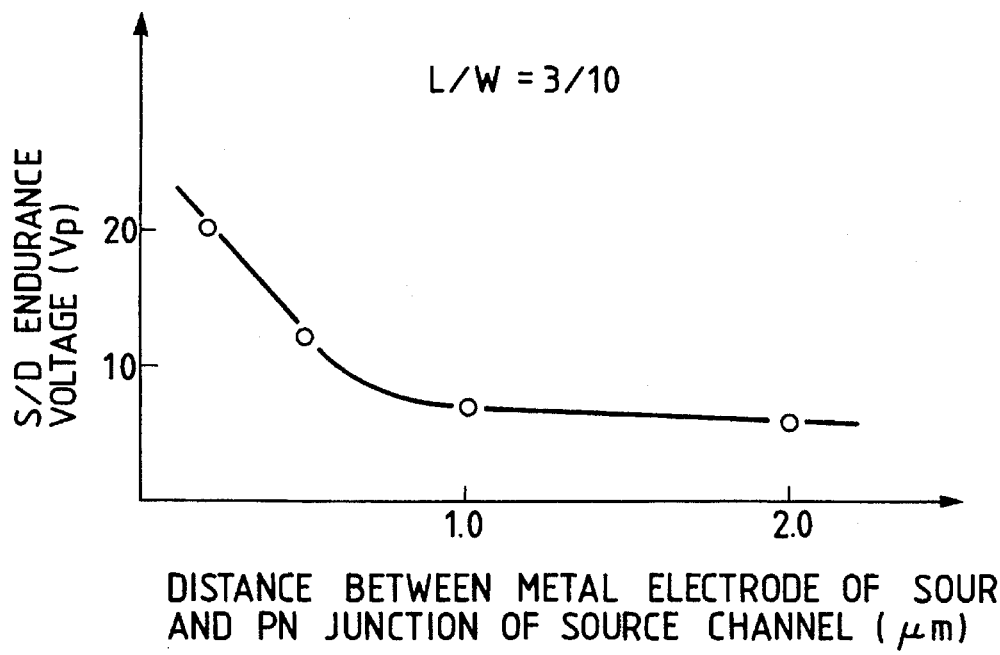

FIG. 23D is a drawing showing the relation of the distance between the source metal electrode and the source-channel PN junction to the source-drain endurance voltage, as described in detail below. As shown in the drawing, the source-drain endurance voltage is increased with a decrease in the distance between the source metal electrode and the source-channel PN junction.

In the case of a N-MOS field effect transistor, the semiconductor energy gap $Eg_1$ of the channel portion is greater than the semiconductor energy gap $Eg_2$ of the source portion. In this case, the holes generated at the drain edge by impact ionization first flow into the channel portion. However, if the potential barrier between the source and channel is low, the holes are easily discharged to the source. Since no hole is thus accumulated in the channel portion without producing the substrate floating effect, good saturation properties and a high drain endurance voltage can be obtained. On the other hand, in the case of a P-MOS field effect transistor, the semiconductor energy gap $Eg_1$ of the channel portion is smaller than the semiconductor energy gap $Eg_2$ of the source portion.

(Embodiment 1)

Figure 26A:
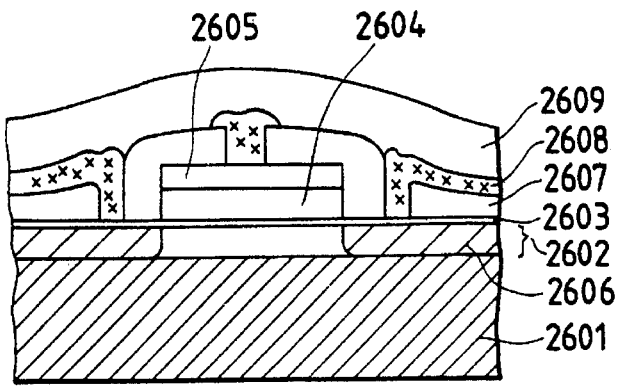
FIG. 26A is a schematic sectional view of an MIS field effect transistor according to Embodiment 1 of the present invention.
Figure 26B:
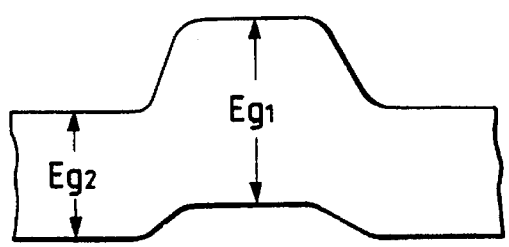
FIG. 26B is a drawing showing the energy band of the same MIS field effect transistor in the channel direction in thermal equilibrium.
Figure 26C:
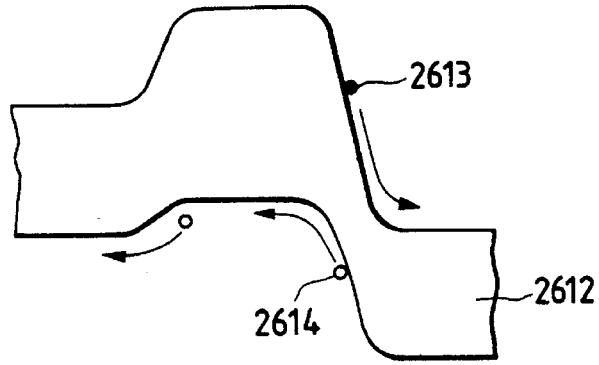
FIG. 26C is a drawing showing the energy band of the same transistor when a drain voltage is applied thereto.

A first embodiment of the present invention is described below with reference to the drawings. FIG. 26A is a schematic sectional view for explaining the first embodiment. In the drawing, reference numeral 2601 denotes a ground silicon oxide film; reference numeral 2602, a semiconductor layer; reference numeral 2603, a thermal oxidation film; reference numeral 2604, a polycrystalline silicon film; reference numeral 2605, a sulfur nitride glass layer; reference numeral 2607, an interlayer insulating film; reference numeral 2608, a wiring electrode; and reference numeral 2609, a protective film. FIG. 26B is a drawing showing the energy band of the MIS field effect transistor shown in FIG. 26A in the channel direction in thermal equilibrium, and FIG. 26C is a drawing showing the energy band when a drain voltage is applied to the same transistor.

A description will now be made of the process of producing the MIS field effect transistor shown in FIG. 26 with reference to FIGS. 27A to 27C. Oxygen ions were injected into a silicon wafer 2704 with a substrate concentration of $1 \times 10$ cm$^{-3}$ under the conditions of an acceleration voltage being 200 KeV, and a dose being $3.0 \times 10^{18}$ cm$^{-2}$, followed by heat treatment at 1300° C. for 6 hours to form a gorund silicon oxide film 2741. The thus-obtained SIMOX substrate had a semiconductor layer 2742 having a thickness of 1000 Å. After a thermal oxidation film 2743 having a thickness of 500 Å had been formed on the SiMO$_x$ substrate by heat treatment at 950° C. for 30 minutes, a polycrystalline silicon film 2744 was deposited to a thickness of 4000 Å by a low-pressure CVD process. A sulfur nitride glass layer 2745 was then deposited to a thickness of 3000 Å by an atmospheric CVD process, and a gate was formed by patterning. The energy band gap Eg$_1$ of the gate portion was 1 eV.

In order to form a semiconductor having a small energy band gap in the source and drain portions, Ge was then implanted with self alignment by using as a mask material the polycrystalline silicon film 2744 and the sulfur nitride glass 2745, both of which had been already formed. In this embodiment, Ge was introduced by ion implantation under the conditions that R$_p$ (a concentration of ions injected from a surface shows a curve of distribution raising from the surface to a peak and falling from the peak—"R$_p$" denotes the distance between the surface and the peak of the impurity concentration) was 500 Å, i.e., at an acceleration voltage of 500 KeV, and a dose of $4 \times 10^{17}$ cm$^{-2}$, so that the mixed crystal rate of Ge was 40%, followed by heat treatment at 900° C. for 1 hour. As a result, a good Si—Ge mixed crystal having an energy band gap Eg$_2$ of 0.74 eV was formed in the source and drain portions. This energy band gap Eg$_2$ was smaller than the energy band gap Eg$_1$ of the gate portion by about 0.36 eV.

Phosphorous ions were then injected at an acceleration voltage of 60 KeV and a dose of $3 \times 10^{15}$ cm$^{-2}$, and phosphorous glass was deposited to a thickness of 6000 Å to form an interlayer insulating film 2747 by an atmospheric CVD process and then activated by heat treatment at 800° C. for 20 minutes. Contact holes were formed in the interlayer insulating film 2747 so that an Al wiring electrodes 2748 were formed therein, followed by heat treatment at 400° C. for 1 hour. Phosphorous glass was then deposited to a thickness. of 8000 Å to form a protective film 2749 by a CVD process.

Figure 26D:
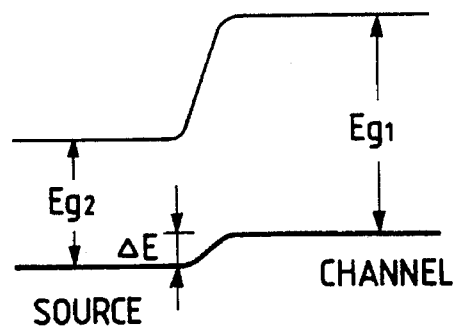
FIG. 26D is a drawing for explaining a relation in the energy band gap between the channel and source/portions.
Figure 27A:
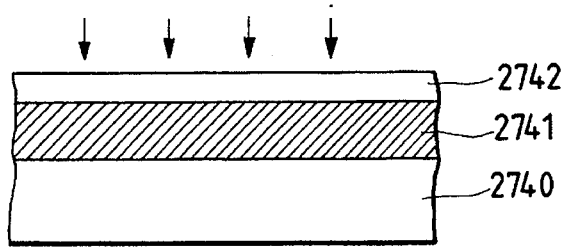
FIGS. 27A to 27C are drawings for explaining the process of producing the transistor shown in FIG. 26.
Figure 27B:
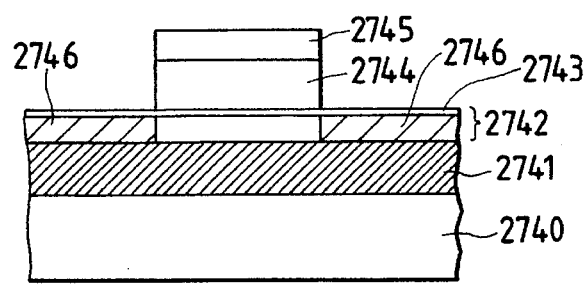
Figure 27C:
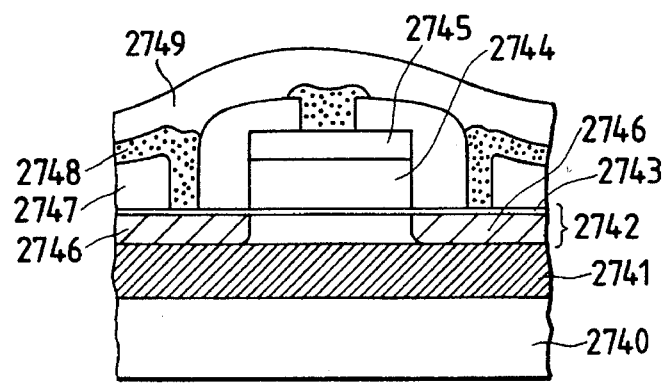

FIG. 26B is a drawing showing the energy band of the MIS field effect transistor shown in FIG. 26A in the channel direction thereof, FIG. 26C is a drawing showing the energy band when a bias is applied to the transistor, and FIG. 26D is a drawing showing the energy band of the heterojunction between the source and channel portions. As described above, the energy band gap Eg$_2$ of the source portion is 0.74 eV and has a Fermi level at a position near the valence band rather than the mid gap. While the energy band gap Eg$_1$ of the channel portion is 1.1 eV and has a Fermi level at about 0.28 eV from the mid gap on the valence band side. The barrier ΔE between the source and channel to the movement of the holes is thus about 0.45 eV even if no bias is applied. This value can be easily exceeded by thermal excitation. The holes generated at the drain edge are thus smoothly discharged to the source portion, without producing the problems with respect to the occurrence of the kink phenomenon and the deterioration in the source-drain endurance voltage, which are caused by the substrate floating effect or the like.

Figure 28:
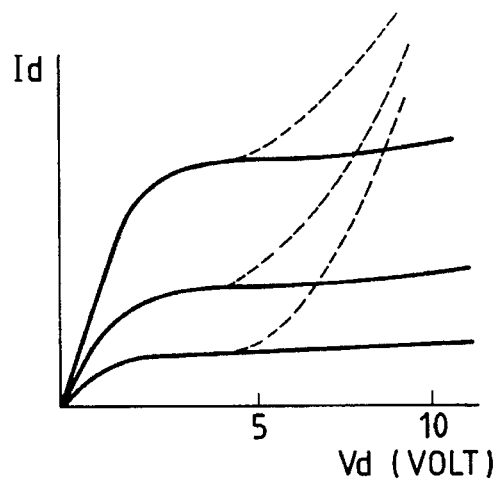
FIG. 28 is a drawing showing the characteristics of the transistor shown in FIG. 26.

In FIG. 28, solid lines show the results of measurement of the Vd-Id characteristics of the MIS field effect transistor produced under the above-described conditions. It was confirmed from the measurement that the source-drain voltage is 20 V or more and is significantly increased. The broken lines in FIG. 28 show the characteristics of a field effect transistor having the source and channel portions with the same energy band gap. The field effect transistor exhibits excellent saturation characteristics at about 5 volt.

(Embodiment 2)

A second embodiment of the present invention is described below with reference to FIGS. 12, 13, 14 and 15.

Figure 12A:
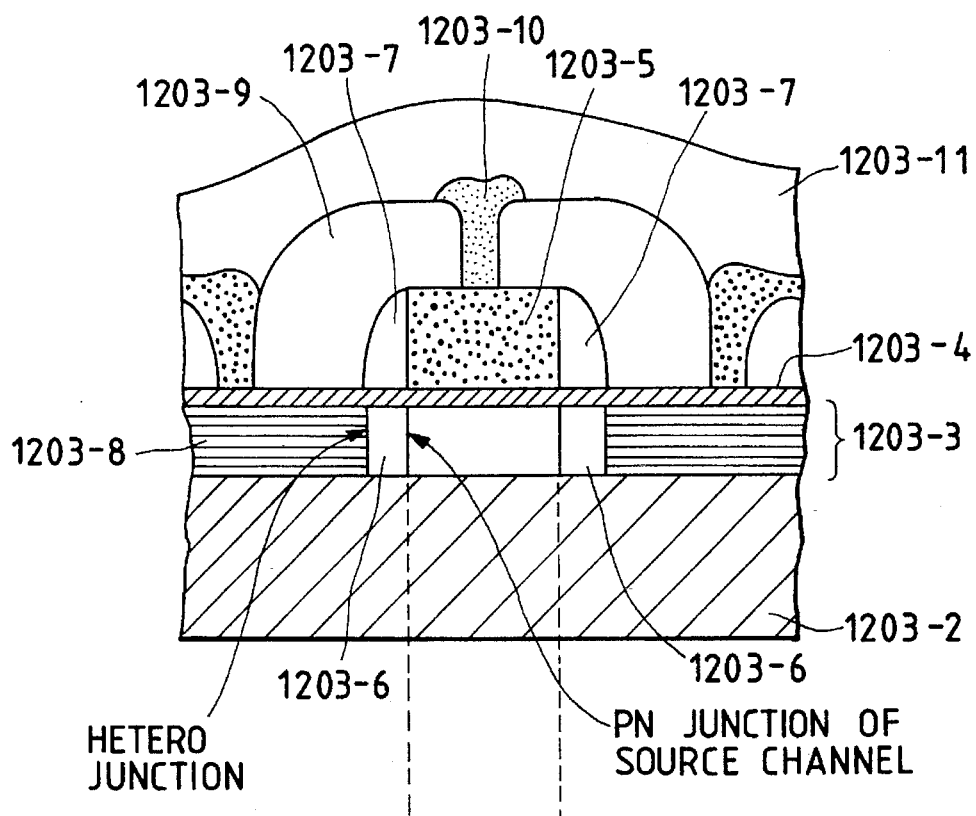
FIG. 12A is a sectional drawing showing the structure of a thin film SOI-MIS transistor of the present invention.
Figure 12B:
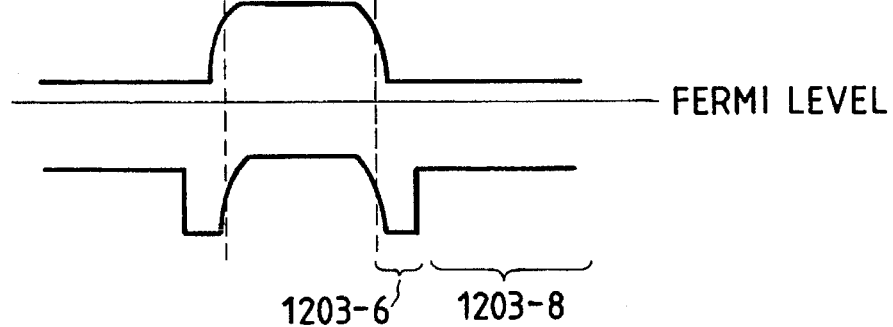
FIG. 12B is a drawing showing the energy band of the same.

FIG. 12A is a sectional view of the structure of an MIS transistor in the second embodiment, and FIG. 12B is a drawing showing the energy band of the same. FIG. 13 is a drawing for explaining the energy band of the transistor in this embodiment, FIG. 14 is a schematic sectional view for explaining the process of producing the transistor in the embodiment, and FIG. 15 is a drawing showing the characteristics of the transistor according to the embodiment, The second embodiment is described below with reference to the production process shown in FIG. 14.

Figure 14A:
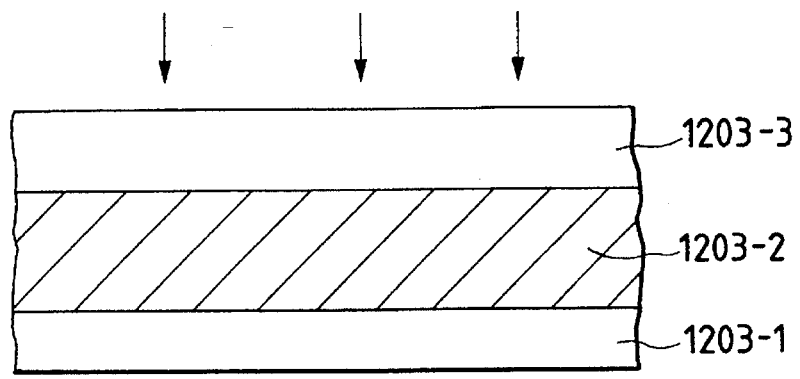
FIGS. 14A to 14E are sectional view for explaining the process of producing a transistor according to Embodiment 2.

An SiO$_2$ film 1203-2 having a thickness of 5000 Å was formed as a ground insulating film on a silicon wafer 1203-1, and an Si layer 1203-3 having a thickness of 500 Å was then formed as a semiconductor active layer on the SiO$_2$ film to form a SIMOX substrate having a substrate concentration of 1E+16 cm$^{-3}$ (=$1 \times 10^{16}$ cm$^{-3}$) (FIG. 14A).

Figure 14B:
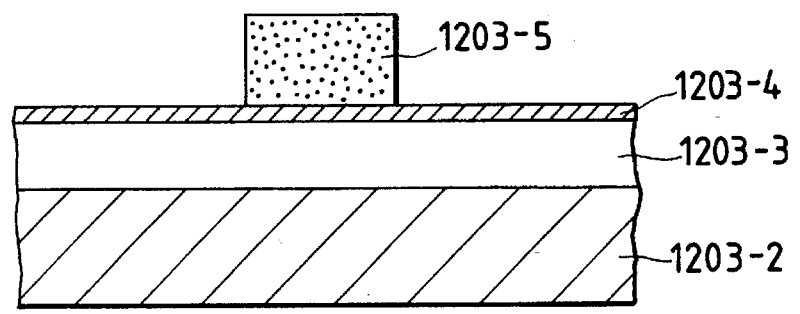

A gate insulating film 1203-4 of 500 Å was then formed by thermal oxidation at 900° C. for 30 minutes, and a polycrystal Si was deposited to 4000 Å by the LP-CVD process. After boron had been then injected by ion implantation with an injection energy of 20 KeV and a dose of 4E+15 cm$^{-2}$ (=$4 \times 10^{15}$ cm$^{-2}$), a P-type polycrystalline Si gate electrode 1203-5 was formed by photolithography (FIG. 14B).

Figure 14C:
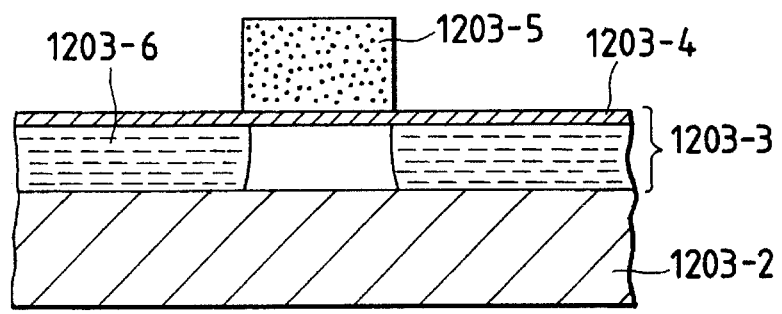

P$^{31+}$ ions were then injected with an injection energy of 60 KeV and a dose of 1E+15 cm$^{-2}$ (=$1 \times 10^{15}$ cm$^{-2}$) by using as a mask the gate electrode 1203-5, followed by heat treatment at 950° C. for 20 minutes to form source and drain regions 1203-6 (FIG. 14C).

SiO$_2$ was then deposited by the CVD process and subjected to anisotropic etching to provide a side wall 1203-7.

Ge ions were then injected by using as a mask material the side wall 1203-7 and the gate electrode 1203-5. The conditions of the ion injection were an injection energy of 130 KeV and a dose of 1E+17 cm$^{-3}$. Heat treatment was then performed at 950° C. for 30 minutes to form source and drain regions 1203-8 made of SiGe as a second semiconductor material.

Figure 14D:
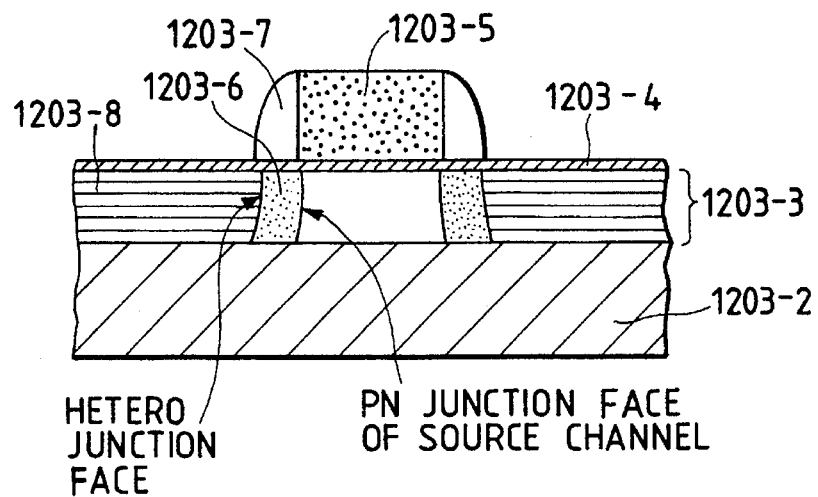
Figure 14E:
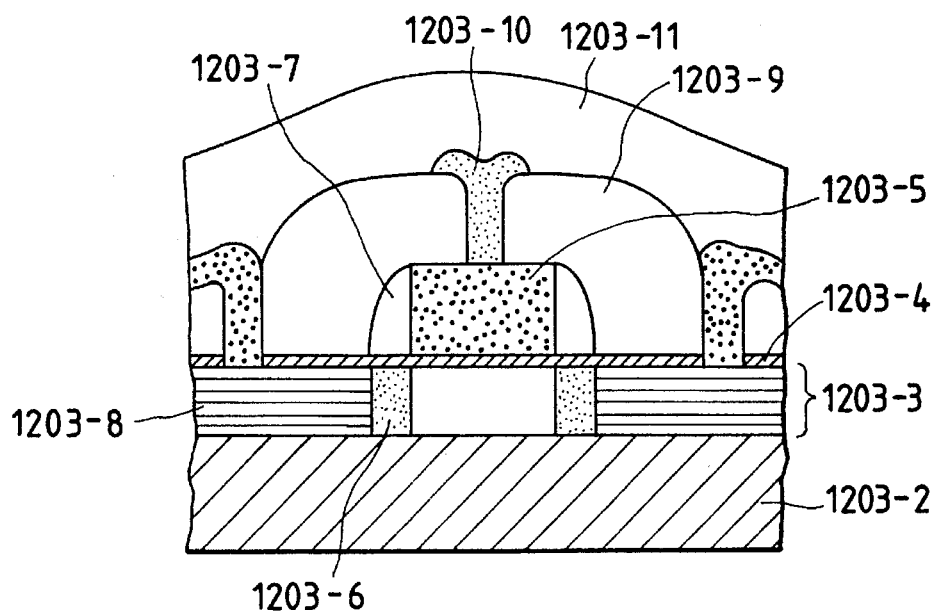
Figure 14F:
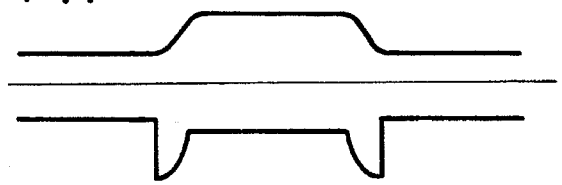
FIG. 14F is a drawing the energy band thereof.

As a result, an Si—SiGe heterojunction was provided in the source and drain regions, the heterojunction being placed at about 5000 Å from the source-channel PN junction face (FIG. 14D).

PSG (phosphorous glass) was then deposited to 6000 Å by the CVD process to form an interlayer insulating film 1203-9.

Wiring Al electrodes 1203-10 were deposited by the sputtering method. After PSG had been deposited to 8000 Å as a protective film 1203-11, heat treatment was performed at 400° C. for 30 minutes to form the SOI-MIS transistor of this embodiment shown in FIG. 14E or FIG. 12A.

In this embodiment, the mixing ratio of SiGe was Si:Ge= 5:1, and the energy band gap of the formed SiGe portion was about 0.9 eV.

FIG. 12B shows the energy band gap of the embodiment.

As shown in FIG. 13, in this embodiment, the heterojunction is vertically formed, on the substrate, at a distance of about 5000 Å from the PN junction face between the source and channel. Since the width of the depletion layer of the source portion is about 3000 Å, the heterojunction is not included in the depletion layer of the PN junction. The whole heterojunction face is contained within the diffusion length $L_d$ (about 1 to 2 μm) from the depletion layer edge.

FIG. 15 shows the device characteristics of this embodiment.

Figure 15A:
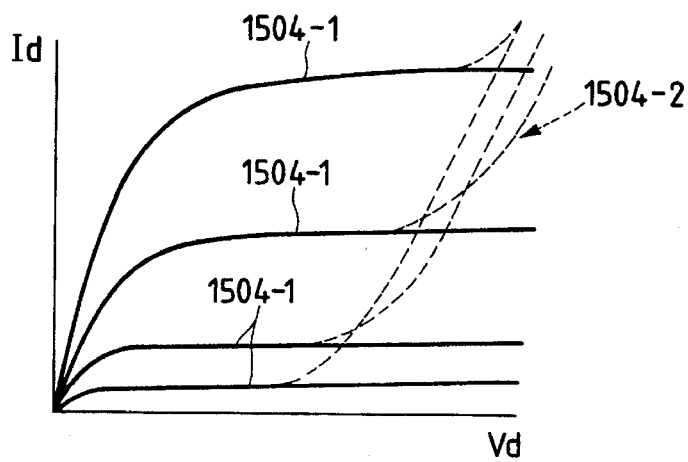
FIGS. 15A and 15B are drawings respectively showing the Id-Vg characteristics of a transistor according Embodiment 2 and the log(Id)-Vg characteristics of the same.

FIG. 15A shows the Id-Vd characteristics in which solid lines 1504-1 show the results of this embodiment, and dotted lines 1504-2 show the results of a silicon thin film SOI-MIS transistor containing no heterojunction. It is found from the drawing that the source-drain endurance voltage is significantly increased to 20 V or more by providing the heterojunction within the diffusion length $L_d$ from the depletion edge of the PN junction.

Figure 1B:
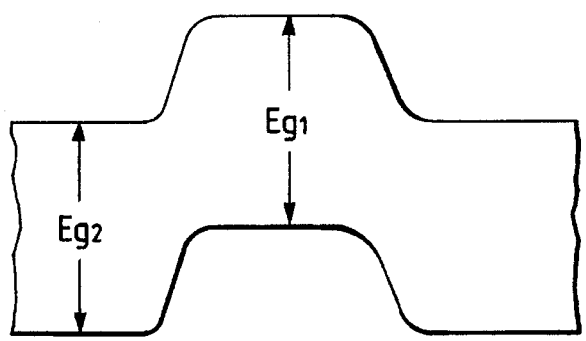
FIG. 1B is a drawing showing the energy band of the same transistor in the channel direction in thermal equilibrium.
Figure 1C:
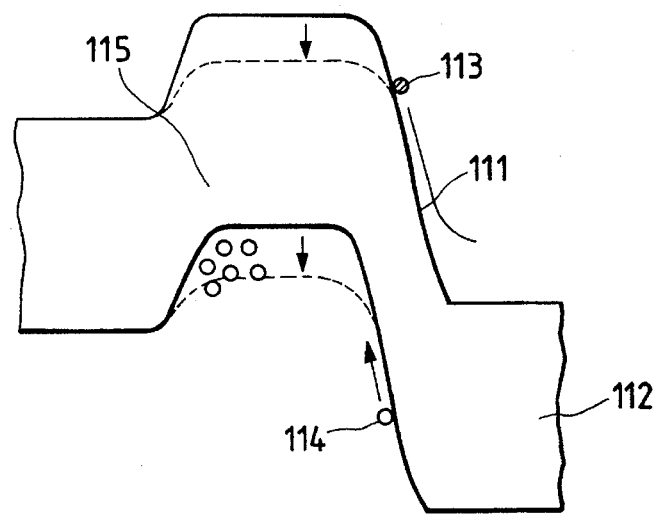
FIG. 1C is a drawing showing the energy band of the same transistor when a drain voltage is applied thereto.
Figure 2:
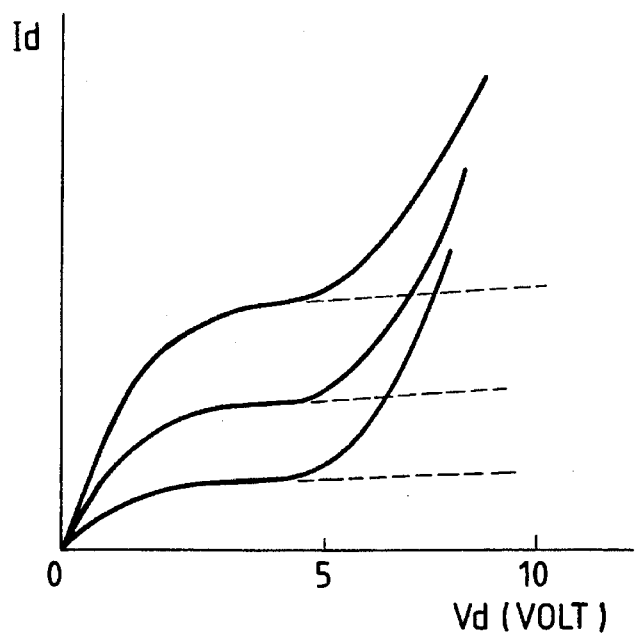
FIG. 2 is a drawing showing the characteristics of the transistor shown in FIG. 1.
Figure 15B:
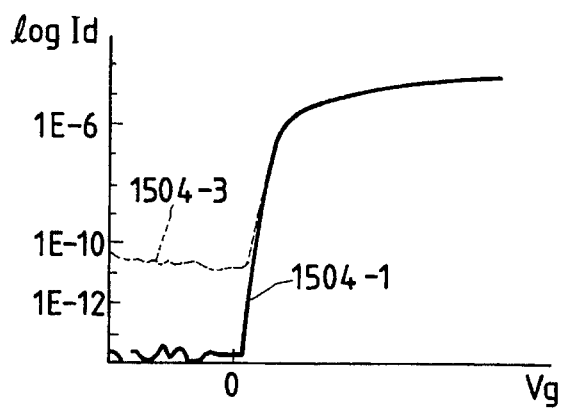

FIG. 15B shows the log Id-Vg characteristics when the drain endurance voltage is 5 V. In the drawing, a solid line 1504-1 shows the characteristics of the embodiment, and a dotted line 1504-3 shows the characteristics of the thin film SOI-MIS transistor containing a heterojunction and having the sectional structure shown in FIG. 1. The dark current (current at Vg=0) of the embodiment is decreased by two figures or more, as compared with the transistor shown in FIG. 1. This is attributed to the separation of the heterojunction interface from the depletion layer region.

Embodiment 3

A third embodiment of the present invention is described below.

A device was formed by using a ZMR (Zone Melting Recrystalization) wafer comprising an Si layer of 4000 Å and ground $SiO_2$ layer of 1 μm according to the same production process as that employed in Embodiment 1. However, the conditions of ion injection in the source and drain regions were an energy of 60 KeV and a dose of 2E+15 $cm^{-2}$, and the conditions of Ge ion injection for forming the second semiconductor material were an energy of 130 KeV and a dose of 2E+17 $cm^{-2}$.

A general thin film SOI-MIS transistor containing no Ge ions was formed by the same production method and compared with the transistor of this embodiment.

As a result, the thin film SOI-MIS transistor containing the heterojunction according to the embodiment of the present invention produced no kink phenomenon and had the good characteristics that the source-drain endurance voltage was 20 V or more, and the dark current was 0.1 to 1 $nA/cm^2$.

Embodiment 4

A fourth embodiment of the present invention is described below with reference to the sectional view of the production process shown in FIG. 16.

Figure 16A:
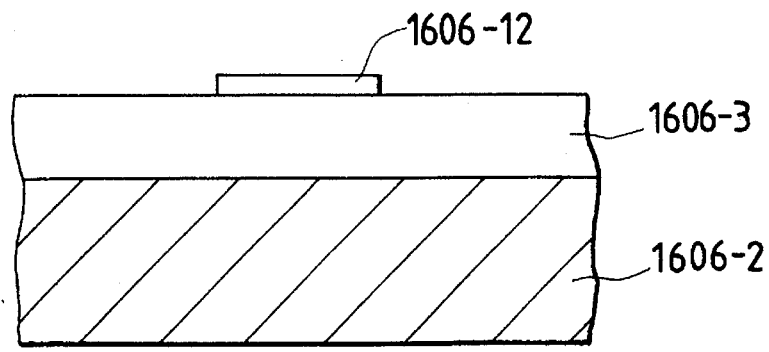
FIGS. 16A to 16E are sectional views of the process of producing a transistor according to Embodiment 4.

A CVD oxide film 1606-2 was deposited to 1 μm as a ground insulating film on a melt quartz substrate, and LPCVD polycrystalline silicon was then deposited to 2000 Å on the CVD oxide film 1606-2. An eximer laser was applied to the polycrystalline silicon so as to melt and recrystallize it to form an SOI substrate having a silicon semiconductor active layer 1606-3 having a thickness of 2000 Å (FIG. 16A).

Figure 16B:
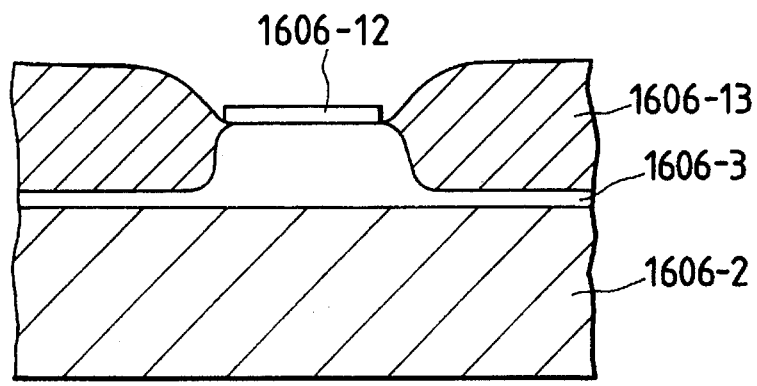

A silicon nitride film 1606-12 was then deposited on a portion corresponding to a channel, and a thermal oxidation film 1606-13 was then formed by using as a mask the silicon nitride film 1606-12. The oxidation of the silicon layer was performed so that the silicon layer 1606-3 remained in a thickness of about 300 to 500 Å (FIG. 16B).

Figure 16C:
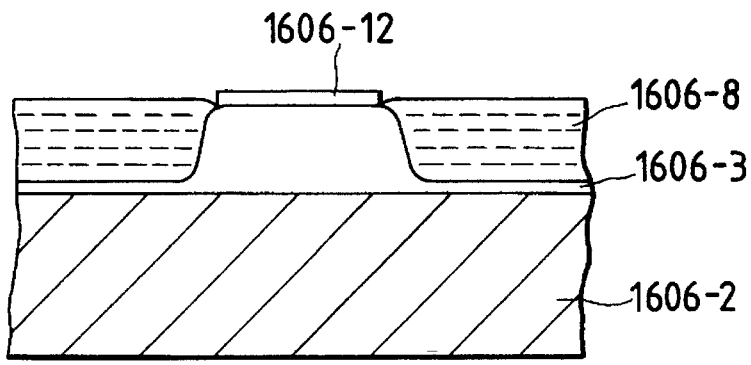

A SiGe layer 1606-8 made of a second semiconductor material was then formed by epitaxial growth from the exposed silicon layer 1606-3 using a gas mixture $SiH_4$/GeH (FIG. 16C).

A CVD silicon oxide film was then deposited to 500 Å as a gate insulating film 1606-4.

Figure 16D:
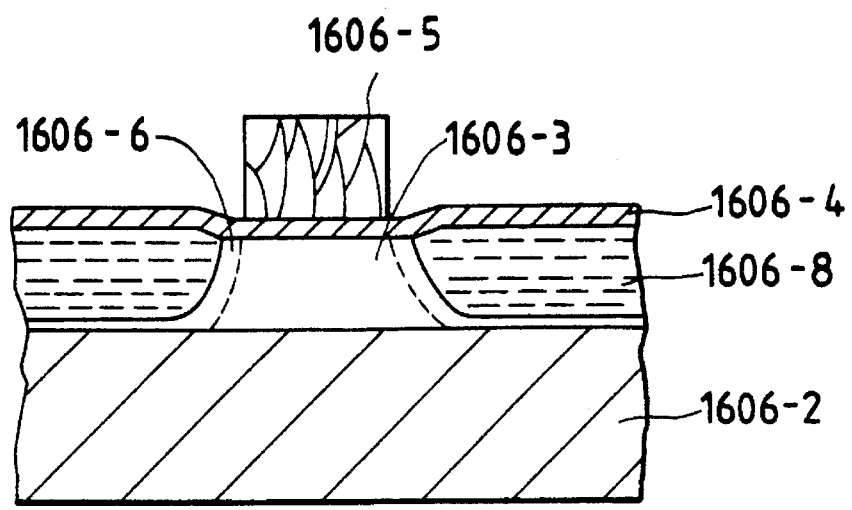

A polycrystalline silicon gate electrode 1606-5 was then formed on the film 1606-4 so as to be offset from the SiGe:Si heterojunction face by about 0.5 μm. Impurities were introduced into the source and drain regions by using as a mask material the polycrystalline silicon under the same injection conditions as those in the above-described embodiments to form first semiconductor material portions 1606-6 (FIG. 16D).

Figure 16E:
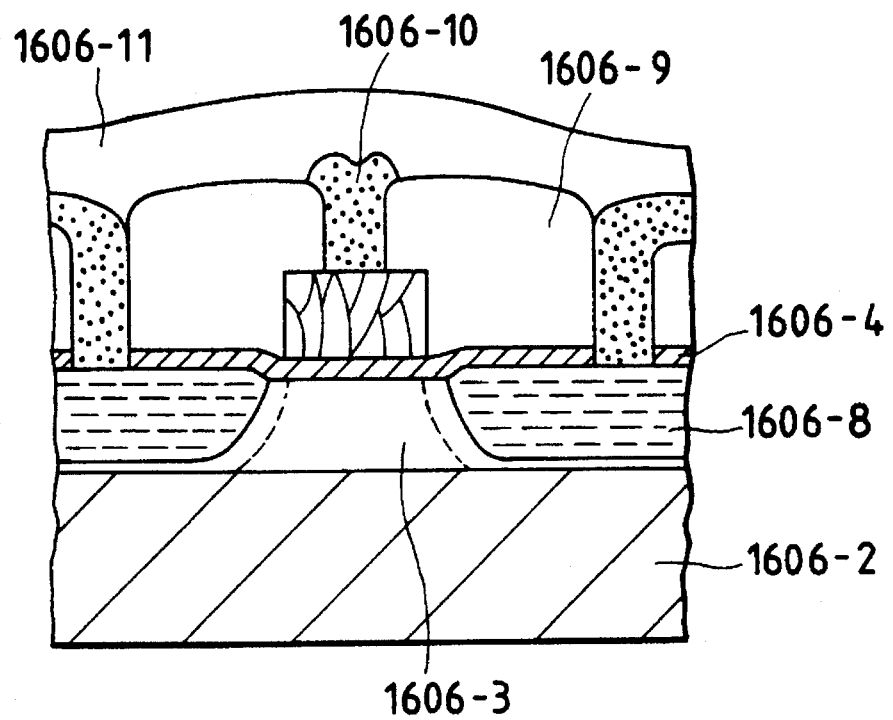

The subsequent heat treatment and the formation of an interlayer insulating film 1606-9, aluminum electrodes 1606-10 and a protective film 1606-11 were performed by the same method as that employed in the above embodiment to form a thin film SOI-MIS transistor (FIG. 16E).

The thus-formed thin film SOI-MIS transistor of this embodiment was compared with a recrystallized silicon thin film SOI-MIS transistor formed by the same method. As a result, the endurance voltage of the transistor of this embodiment was improved, and the dark current could also be decreased to a value of as low as several $nA/cm^2$.

Embodiment 5

A fifth embodiment of the present invention is described below with reference to the drawings.

Figure 10A:
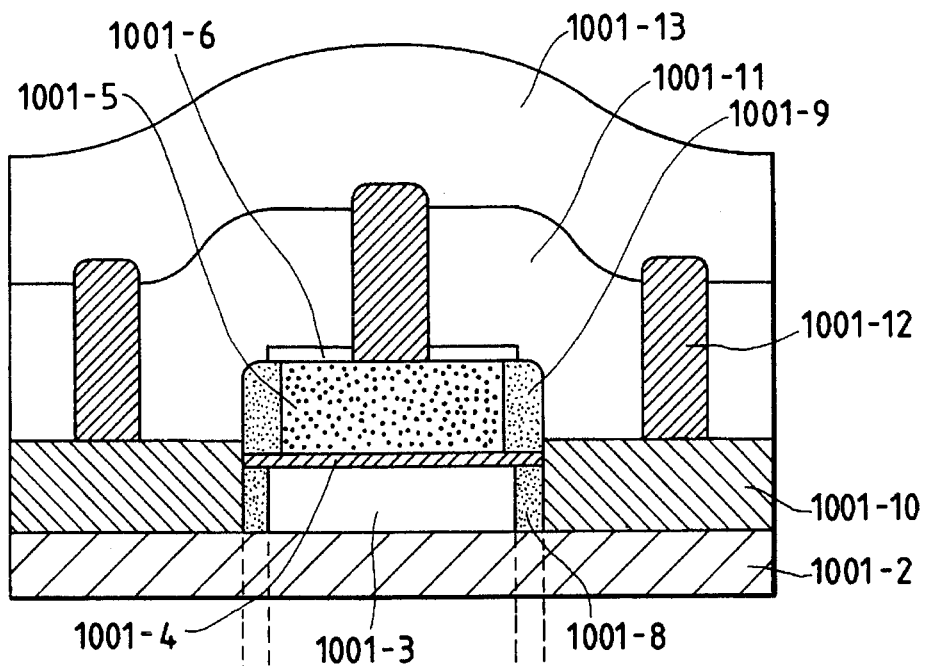
FIG. 10A is a sectional view showing the structure of a transistor of the present invention.
Figure 10B:
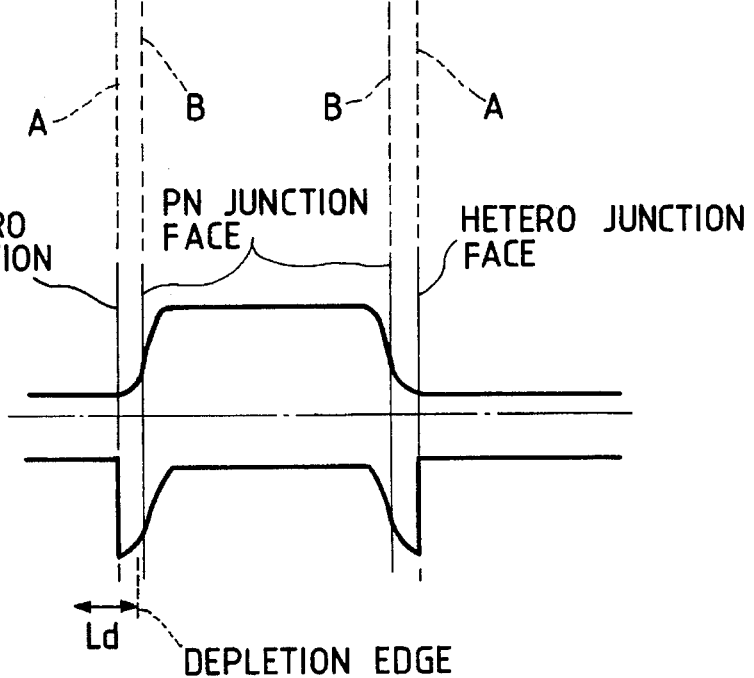
FIG. 10B is drawing showing the energy band of the same.

FIG. 10A (or FIG. 17G) is a schematic sectional view of the structure of an MIS transistor according to this embodiment, and FIG. 10B is a drawing for explaining the energy band thereof.

FIG. 17 is a sectional view showing the prodcution process in this embodiment. Because FIG. 10A is the same as FIG. 17G, this embodiment is described below with reference to the production process of this embodiment shown in FIG. 17.

Figure 17A:
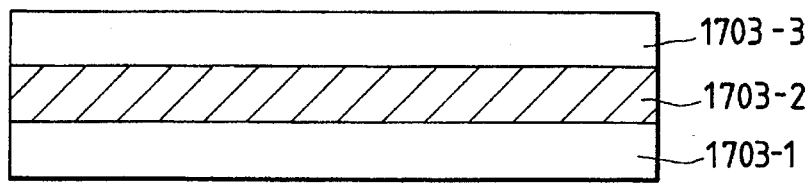
FIGS. 17A to 17G are schematic sectional views for explaining the process of producing a transistor according to Embodiment 5.

As shown in FIG. 17A, a SIMOX substrate having a substrate concentration of 1E+16 $cm^{-3}$ ($=10^{16}$ $cm^{-3}$) and comprising a silicon wafer 1703-1, a ground $SiO_2$ layer 1703-2 having a thickness of 5000 Å and an Si layer 1703-3 having a thickness of 500 Å was formed (FIG. 17A).

Figure 17B:
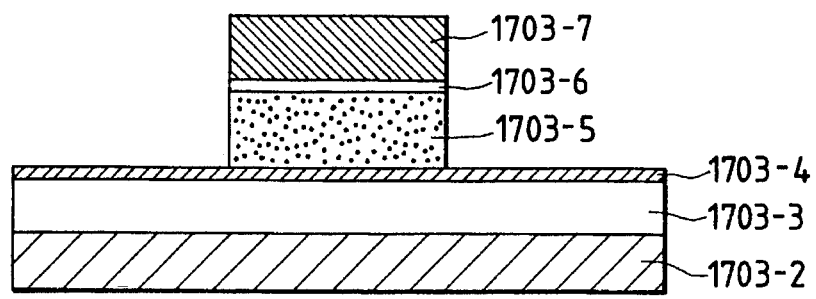

A gate insulating film 1703-4 of 500 Å was then formed on the SIMOX substrate by thermal oxidation at 900° C. for 30 minutes. Polycrystalline silicon was then deposited to 4000 Å by the LP-CVD process, and boron was introduced into the polycrystalline silicon by ion implantation. A polycrystalline Si gate electrode 1703-5 was then formed by using as a mask material a resist 1703-7 and $Si_3N_4$ 1703-6 (FIG. 17B).

Figure 17C:
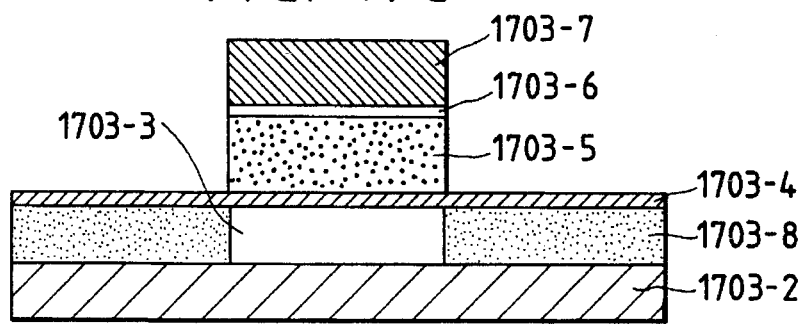

First ion implantation was then performed by using as a mask material the gate electrode 1703-5 for introducing impurities in source and drain regions 1703-8 (FIG. 17C).

Figure 17D:
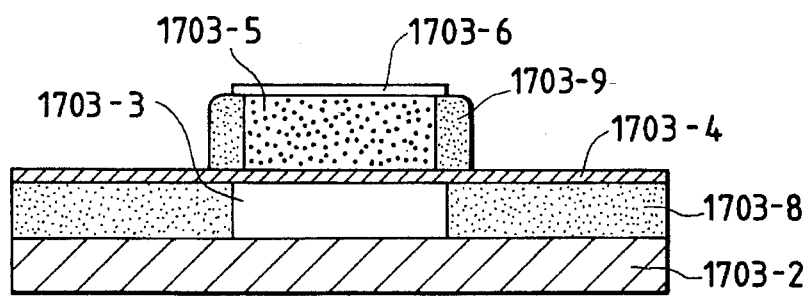

After the resist 1703-7 was removed with leaving the $Si_3N_4$ 1703-6, the polycrystalline silicon of 2500 Å was subjected to side oxidation to form a layer 1703-9 (FIG. 17D).

Figure 17E:
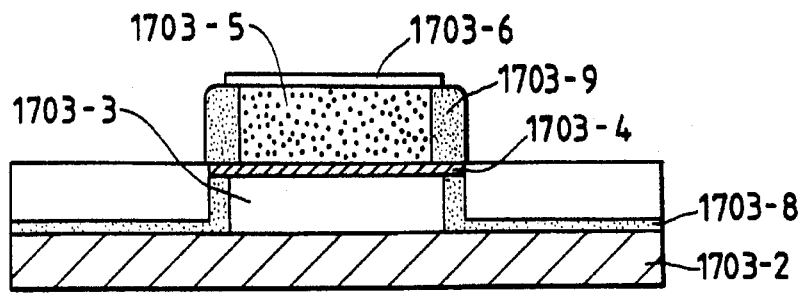

The oxide film and silicon layer in the source and drain regions were then etched by using as a mask material the $Si_3N_4$ 1703-6. During this etching, the silicon layer 1703-8 was not completely etched, with leaving a slight portion (for example, about 50 Å) of the layer 1703-8 (FIG. 17E).

A mixed crystal $Si_xGe_{1-x}$ 1703-10 was then selectively deposited to a thickness of about 500 Å on the silicon layer 1703-8 exposed in the source and drain regions by using a gas mixture $SiH_4/GeH$. The deposited portion comprised silicon, and the non-deposited portion comprised a silicon oxide film and a silicon nitride film. The mixed crystal rate x was 0.1.

$P^{31+}$ was then injected by ion implantation using as a mask the gate electrode (with a polyoxide film) 1703-5, 1703-9 with an injection energy of 60 KeV and a dose of 1E+15 $cm^{-2}$ (=$10^{15}$ $cm^{-2}$), followed by heat treatment at 950° C. for 20 minutes and thermal oxidation.

Figure 17F:
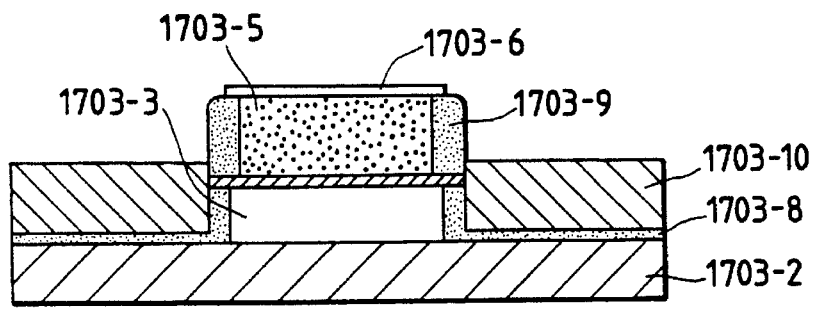

As a result, heterojunctions between Si 1703-8 and $Si_{0.1}Ge_{0.9}$ 1703-10 were provided in the source and drain regions so that the heterojunctions were placed at a distance of about 2500 Å from the source-channel PN junction faces. Namely, the heterojunction faces (1703-8:1703-10) were within the diffusion length $L_d$=about 1 μm from the depletion edges of the PN junctions (1703-3:1703-8) (FIG. 17F).

Figure 17G:
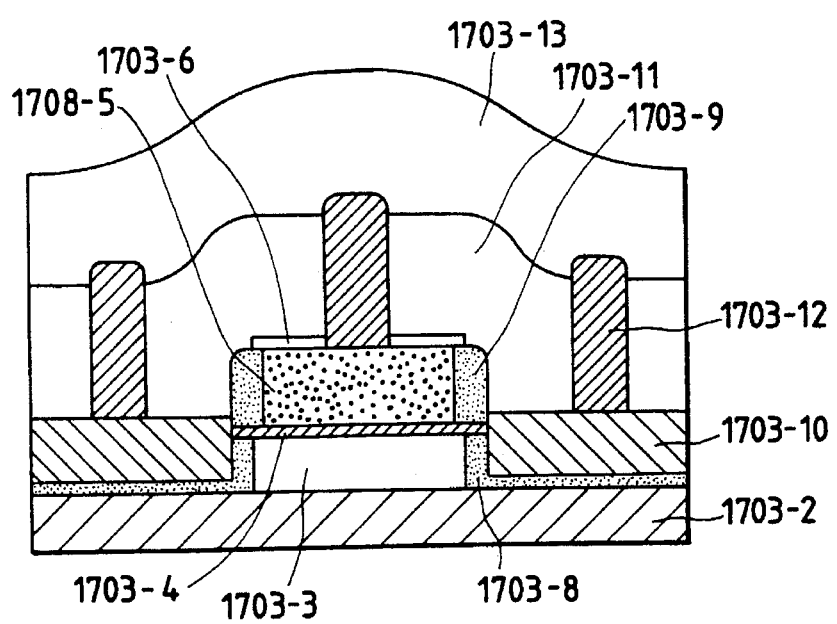

PSG (phosphorous glass) was then deposited to 6000 Å by the CVD process to form an interlayer insulating film 1703-11. Wiring Al 1703-12 was deposited by the sputtering process. PSG was finally deposited to 8000 Å to form a protective film 1703-13 and then subjected to heat treatment at 400° C. for 30 minutes (FIG. 17G).

The transistor of this embodiment shown in FIG. 10A was produced by the above-described method.

FIG. 10B is a drawing showing the energy band of the transistor. In the drawing, character A denotes the heterojunction faces, and character B denotes the PN junction faces, the region between the junction faces A and B being a high-concentration impurity regions comprising the same semiconductor as that of the channel region. The heterojunction faces A comprise a semiconductor having a narrow energy band gap.

FIG. 18 shows the results of measurement of the characteristics of the transistor produced by the above method in this embodiment.

Figure 18A:
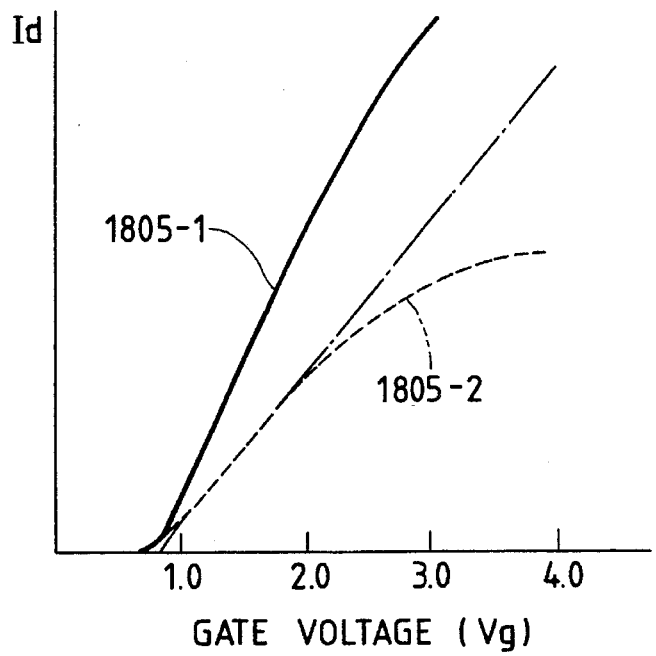
FIGS. 18A and 18B are drawings for respectively explaining the Id-Vd characteristics of the transistor according to Embodiment 5 and the 1/Gm²-L characteristics of the same.

FIG. 18A shows the Id-Vg characteristics in which curve 1805-1 shows the results of this embodiment, and curve 1805-2 shows the results of a thin film SOI-MIS transistor containing hetrojunctions. As shown in the drawing, this embodiment shown by the curve 1805-1 has a good linearity.

In this embodiment, the silicon-germanium mixed crystal in the source region was $Si_{0.1}Ge_{0.9}$ having a mixed crystal rate x of 0.1 and a mobility of about 2000 $cm^2/v.s$ which was about twice that of silicon. This resulted in the formation of a thin film SOI-MIS transistor having good linearity and high driving force Gm and exhibiting no deterioration in the driving force Gm.

Figure 18B:
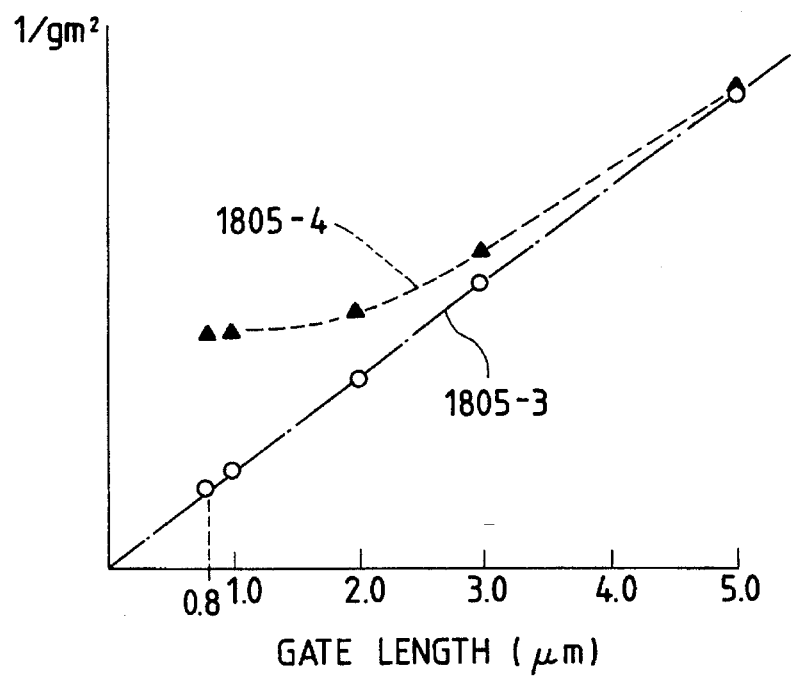

FIG. 18B shows the dependency of the driving force Gm on the gate length. In the drawing, curve 1805-3 shows the results of this embodiment, and curve 1805-4 shows the results of a thin film SOI-MOS transistor containing heterojunctions. The transistor shown by curve 1805-4 has the tendency that the driving force Gm is deviated from an ideal straight line as the gate length is decreased because the parasitic resistance of the source and drain regions is made significant, as compared with the on resistance. However, the transistor of this embodiment shown by curve 1805-3 shows the driving force Gm along the ideal line up to a gate length of about 0.8 μm.

In this embodiment, the endurance voltage between the source and drain was at least 20 V.

Embodiment 6

A sixth embodiment of the present invention is described below with reference to the schematic sectional view for explaining the production process in FIG. 19.

Figure 19A:
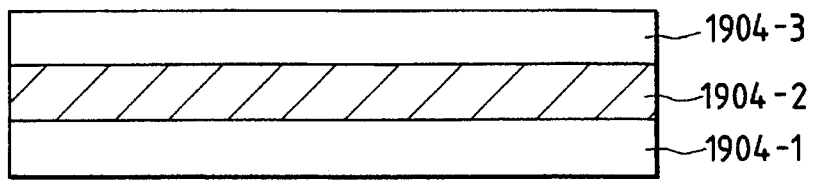
FIGS. 19A to 19G are schematic sectional views for explaining the process of producing a transistor according to embodiment 6.

A ZMR (Zone Melting Recrystallization) substrate having a substrate concentration of 1E+16 $cm^{-3}$ (=$10^{16}$ $cm^{-3}$) and comprising a Si film 1904-3 having a thickness of 500 Å was first formed (FIG. 19A).

Figure 19B:
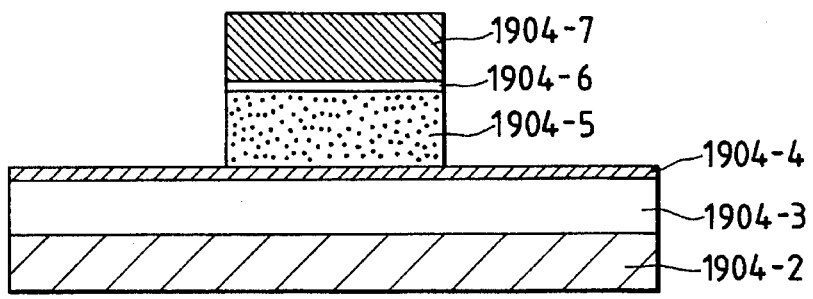

A gate insulating film 1904-4 was then formed on the ZMR substrate by thermal oxidation at 900° C. for 30 minutes. A polycrystalline Si was then deposited to 4000 Å by the LP-CVD process, and boron was introduced therein by ion implantation. A polycrystalline Si gate electrode 1904-5 was then formed by using as a mask material a resist 1904-7 and $Si_3N_4$ 1904-6 (FIG. 19B).

Figure 19C:
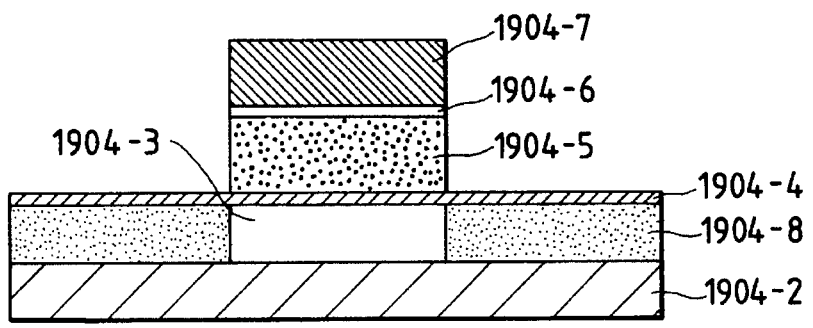

First ion implantation was performed by using as a mask material the gate electrode 1904-5 for introducing impurities into the source and drain regions 1904-8 (FIG. 19C).

Figure 19D:
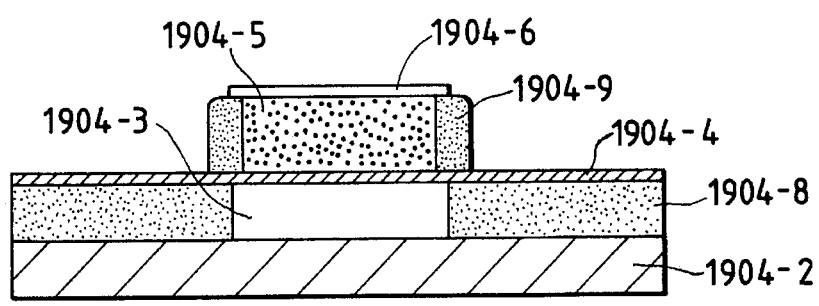

After the resist 1904-7 was then removed with leaving the $Si_3N_4$ 1904-6, the polycrystalline silicon of 2500 Å was subjected to side oxidation 1904-9 (FIG. 19D).

Figure 19E:
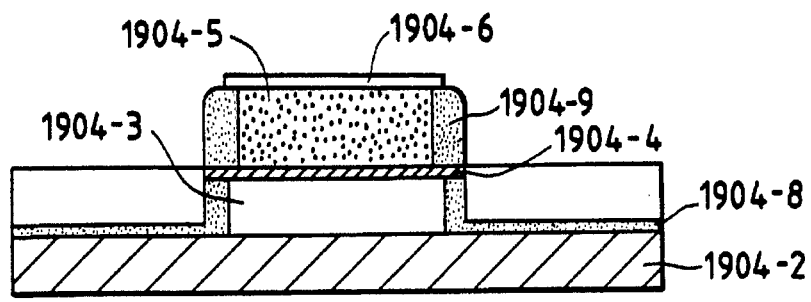

The oxide film and silicon layer in the source and drain regions were then etched by using as a mask the $Si_3N_4$ 1904-6. During this etching, the silicon layer 1904-8 was not completely etched, with leaving a slight portion (for example, about 50 Å) of the silicon layer (FIG. 19E).

Ge 1904-10 was then selectively grown from the silicon portion 1904-8 exposed to the source and drain regions.

Figure 19F:
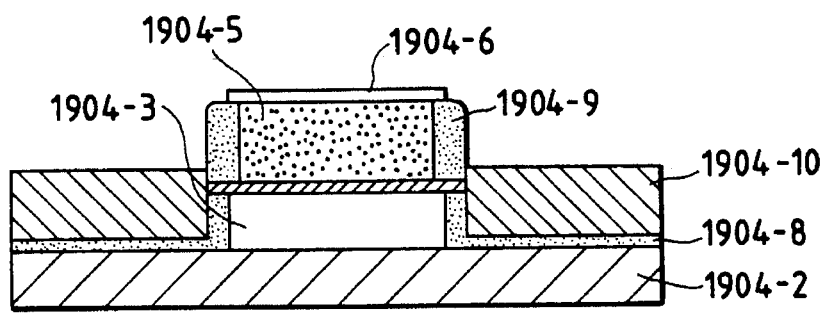

$P^{+31}$ was injected by ion implantation using as a mask the gate electrode (with a polyoxide film) 1904-5, 1904-9 with an injection energy of 60 KeV and a dose of 1E+15 $cm^{-2}$ (=$10^{15}$ $cm^{-2}$), followed by heat treatment at 950° C. for 20 minutes and thermal oxidation. As a result, heterojunctions between Si 1904-8 and Ge 1904-10 were provided in the source and drain regions so that the heterojunctions were placed at a distance of about 2500 Å from the source-channel PN junction faces. Namely, the heterojunction faces (1904-8:1904-10) were within the diffusion length Ld of about 1 μm from the depletion edges of the PN junction portions (1904-3:1904-8) (FIG. 19F).

Figure 19G:
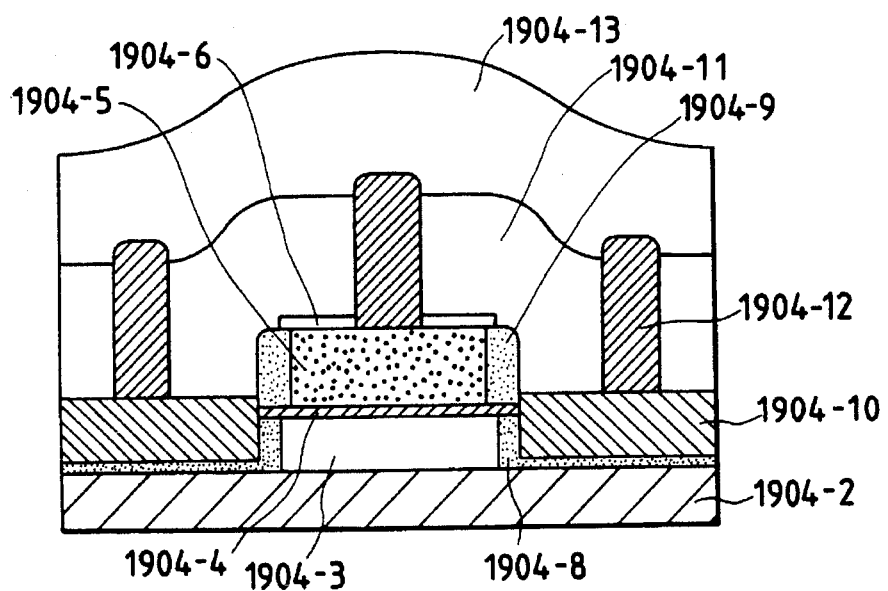

PSG (phosphorous glass) was then deposited to 6000 Å by the CVD process to form an interlayer insulating film 1904-11. Wiring AlSi 1904-12 was deposited by the sputtering process, and PSG was finally deposited to 8000 Å to form a protective film 1904-13, followed by heat treatment at 400° C. for 30 minutes (FIG. 19G).

As a result of measurement of the properties of the thus-formed transistor in this embodiment, the mobility of the source and drain regions was abut 4000 $cm^2/v.s$, and good MOSFET characteristics were obtained in the same way as Embodiment 4.

Embodiment 7

A seventh embodiment of the present invention is described below with reference to FIG. 20.

Figure 20A:
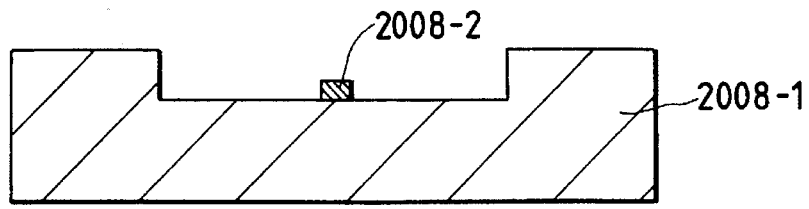
FIGS. 20A to 20H are schematic sectional views for explaining the process of producing a transistor according to Embodiment 7.

As shown in FIG. 20A, a concave portion of 800 Å deep was formed in a portion on a quartz substrate 2008-1 on which MOSFET is formed later. In this embodiment, the concave portion had a size of 40×40 μm. A polycrystalline silicon region of 2 μm square was formed at the center of the concave portion. Heat treatment was then performed in an atmosphere of $H_2$ to change the polycrystalline silicon region to a single crystal silicon region 2008-2 by aggregation (FIG. 20A).

Figure 20B:
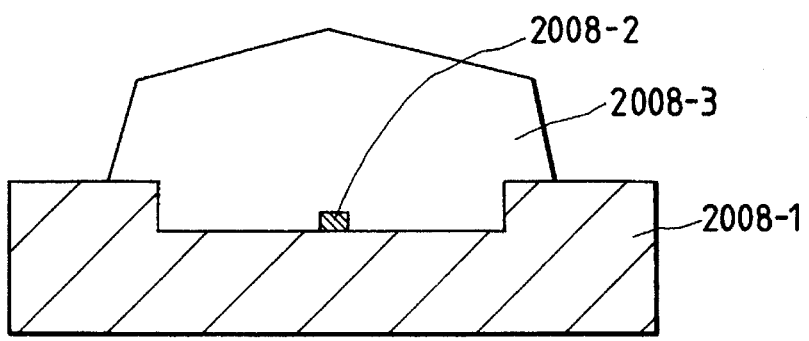

Selective growth was then performed by the CVD process using $GeH/SiH_4$ as a raw material gas and the 2-μm square single crystal silicon region as a seed crystal (FIG. 20B).

Figure 20C:
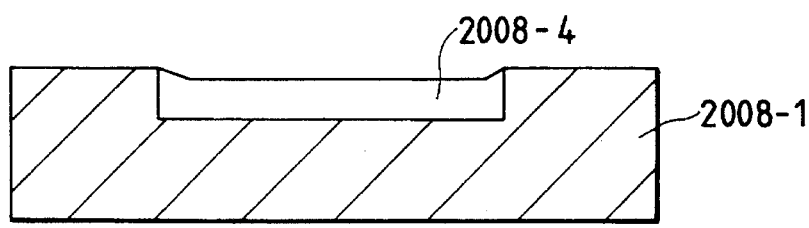

Selective polishing was then performed by using as a stopper the quartz substrate 2008-1 to form a SOI substrate having a single crystal region 2008-4 composed of a mixed crystal $Si_{0.1}Ge_{0.9}$ and selectively formed in the concave portion only. In this embodiment, as a result of measurement, the thickness of the semiconductor layer was about 600 Å (FIG. 20C).

Figure 20D:
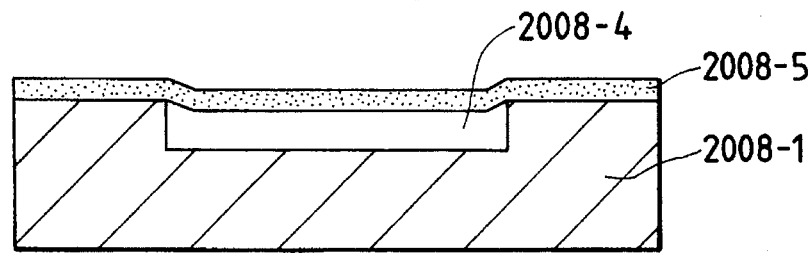

A silicon oxide film 2008-5 was deposited as a gate oxide film on the substrate by the CVD process (FIG. 20D).

Figure 20E:
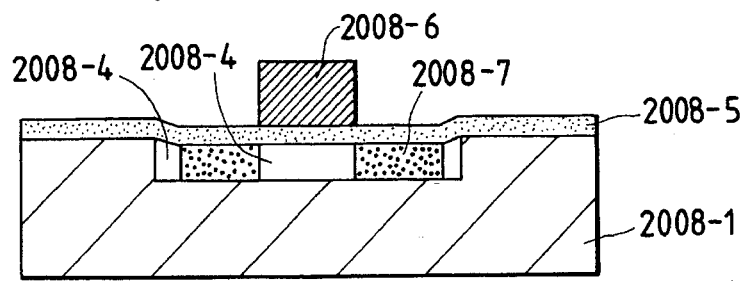

Polycrystalline silicon was then deposited to 4000 Å by the CVD process to form a gate electrode 2008-6. Impurities were introduced by ion implantation using as a mask the gate electrode 2008-6 to form source and drain regions 2008-7 (FIG. 20E).

Figure 20F:
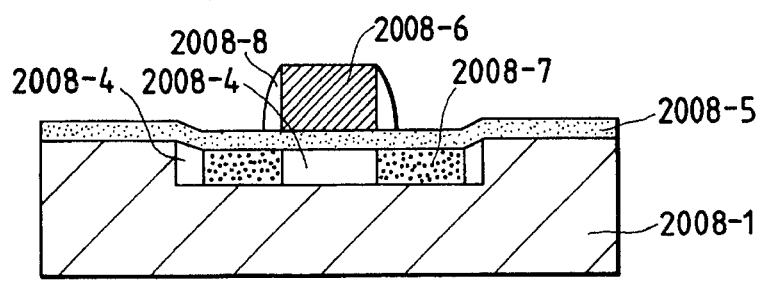

A silicon oxide film was then deposited by the CVD process for forming a side wall. Anisotropic etching was then performed to form a side wall 2008-8 having a thickness of about 1000 Å (FIG. 20F).

Germanium (Ge) ions were then injected by ion implantation using as a mask the gate electrode with the side wall under the conditions of a dose of $2E+16$ cm$^{-3}$ ($=20^{16}$ cm$^{-3}$) and an injection energy of 130 KeV. After the ion implantation, heat treatment was performed at 900° C. for 30 minutes. As a result, the region in which Ge ions were injected was composed of $Si_{0.05}Ge_{0.95}$ (FIG. 20G).

Figure 20G:
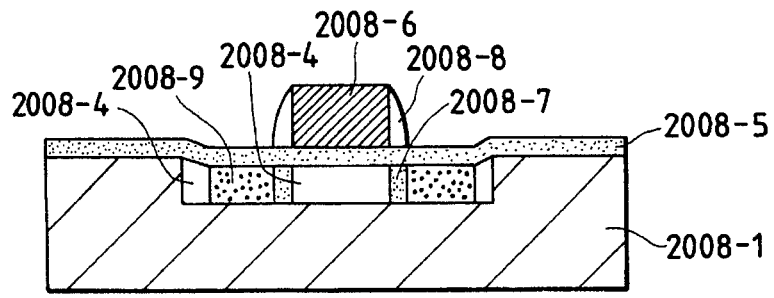
Figure 20H:
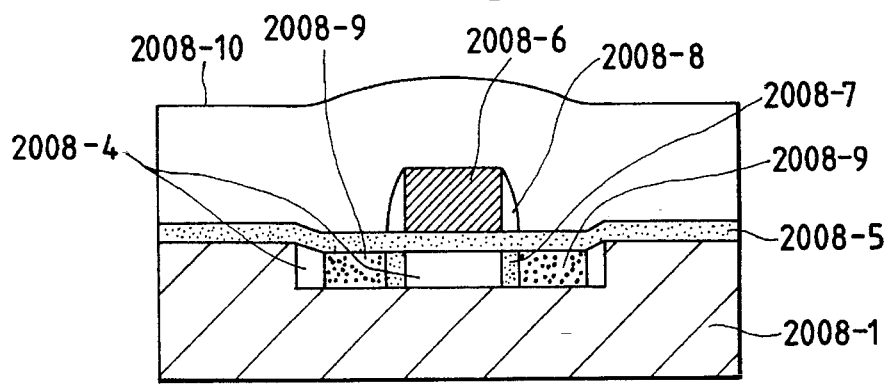

As a result, as shown in FIG. 20G, the channel region 2008-4 and the source and drain regions 2008-7 had the following structure:

(1) the semiconductor layer of the channel region 2008-4 was composed of $Si_{0.1}Ge_{0.9}$;

(2) the source-channel junctions (2008-7:2008-4) was homojunctions composed of $Si_{0.1}Ge_{0.9}$; and (3) a region 2008-9 composed of $Si_{0.05}Ge_{0.95}$ with a germanium mixed crystal rate higher than that of the channel region was provided within a distance of 1000 Å from the depletion edge of the source-channel junction (2008-7:2008-4) on the source side to form a heterojunction (2008-7:2008-9) with the source and drain regions 2008-7 composed of $Si_{0.1}Ge_{0.9}$.

The diffusion length $L_d$ of $Si_{0.1}Ge_{0.9}$ which formed the regions 2008-4 and 2008-7 was about 1 μm which is longer than the above distance 1000 Å.

An interlayer insulating film 2008-10 was then formed by the same method as that employed in Embodiment 6 (FIG. 20H), and metal electrode AlSi and a protective film were further formed thereon.

As a result of measurement of the characteristics of the transistor according to this embodiment, the field effect mobility was as high as about 1200 cm$^2$/v.s, but a good linear region was obtained in the Id-Vg characteristics.

Embodiment 8

A eighth embodiment of the present invention is described below with reference to FIGS. 21, 22 and 23.

Figure 21A:
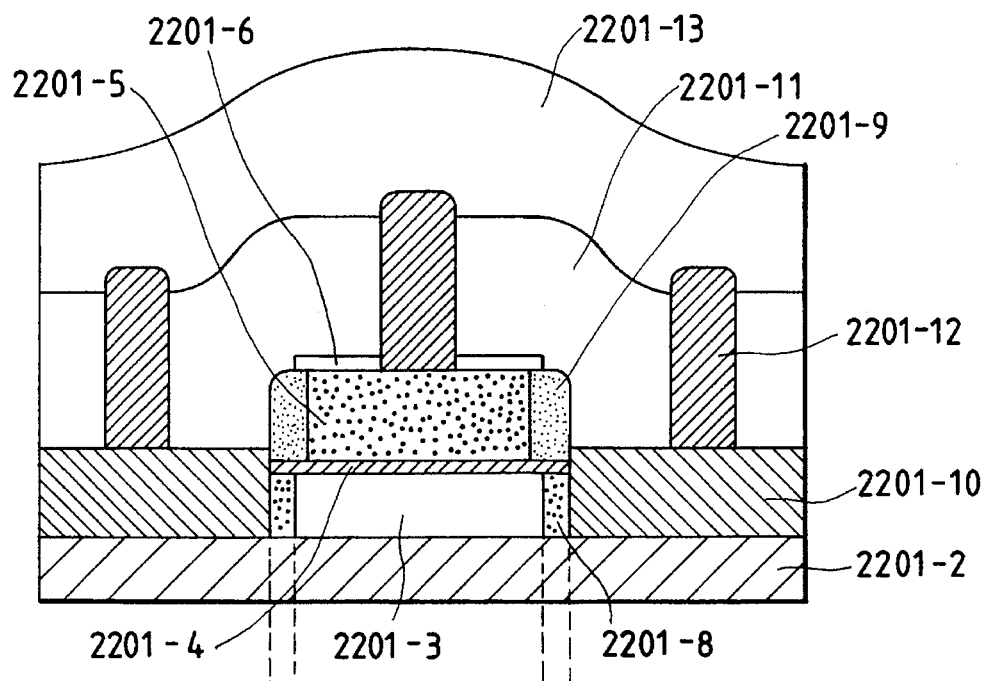
FIGS. 21A and 21B are respectively a sectional view showing the structure of a thin film SOI-MIS transistor according to an embodiment of the present invention, and a drawing of the energy band of the same.
Figure 21B:
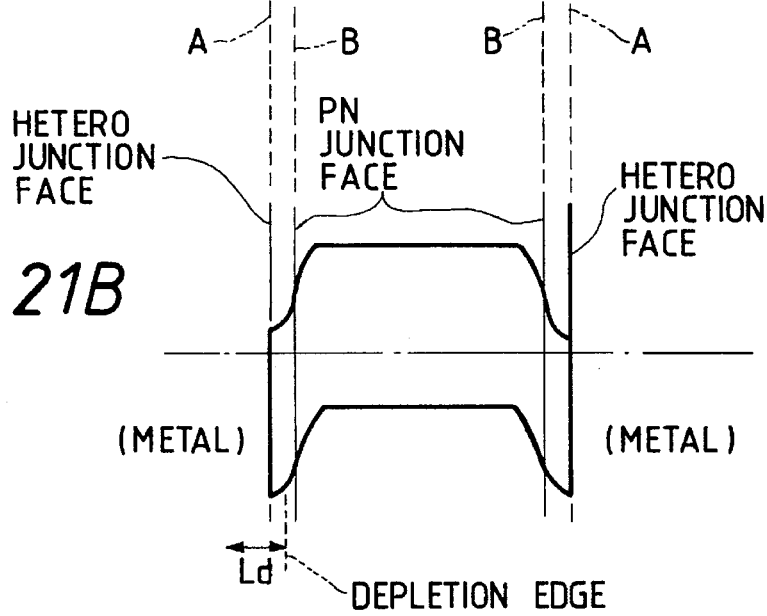

FIG. 21A is a schematic sectional view showing the structure of a SOI-MIS transistor according to this embodiment, and FIG. 21B is a drawing showing the energy band thereof. FIG. 22 is a schematic sectional view for explaining the production process in this embodiment. Since the sectional view of FIG. 21A is the same as FIG. 22G, this embodiment is described with reference to the production process shown in FIG. 22.

Figure 22A:
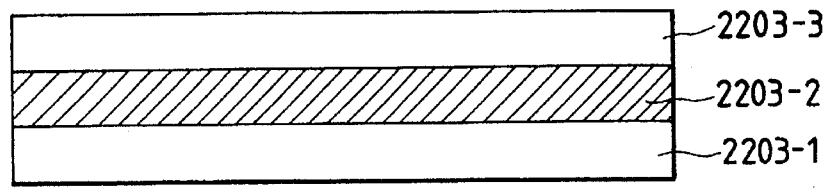
FIGS. 22A to 22G are schematic sectional views for explaining the process of producing a transistor according to Embodiment 8.

As shown in FIG. 22A, a SIMOX substrate having a a substrate concentration of $1E+16$ cm$^{-3}$ ($=10^{16}$ cm$^{-3}$) and comprising a ground $SiO_2$ film 2203-2 having a thickness of 5000 Å and a Si layer 2203-3 having a thickness of 500 Å was formed (FIG. 22A).

Figure 22B:
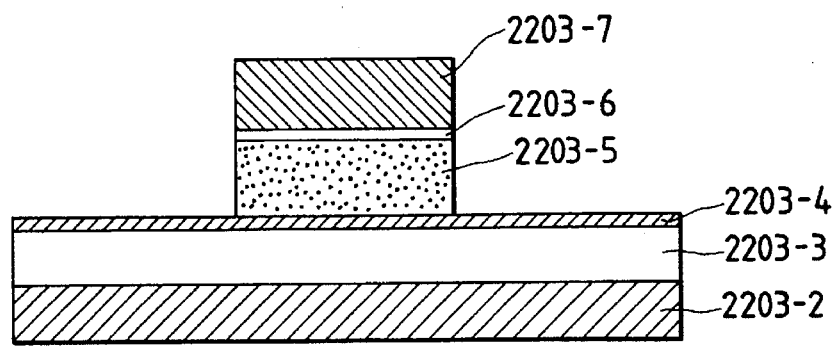

A gate insulating film 2203-4 of 500 Å was then formed on the SIMOX substrate by thermal oxidation at 900° C. for 30 minutes. Polycrystalline Si was then deposited to 4000 Å by the LP-CVD process, and boron was introduced by ion implantation. A polycrystalline Si gate electrode 2203-5 was then formed by using as a mask material a resist 2203-7 and a masking silicon nitride film $Si_3N_4$ 2203-6 (FIG. 22B).

Figure 22C:
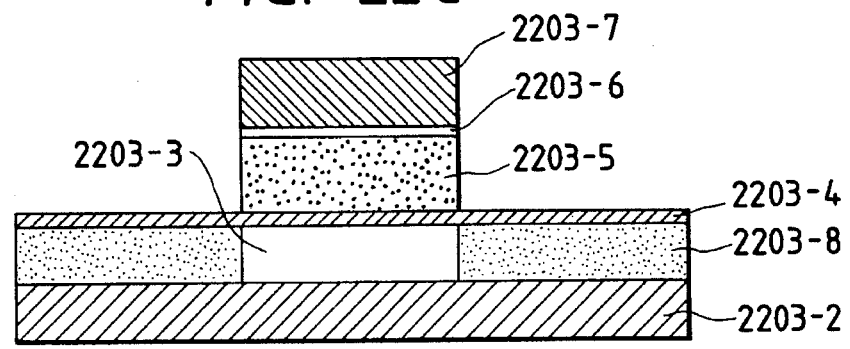

Impurities were then introduced by ion implantation using as a mask material the thus-formed gate electrode 2203-5 to form source and drain regions 2203-8. Phosphorous ($P^{31}$) was used as the impurities, and the ion implantation was effected under the conditions of a dose of $1E+15/cm^2$ ($=10^{15}$ cm$^2$) and an injection energy of 60 KeV (FIG. 22C).

Figure 22D:
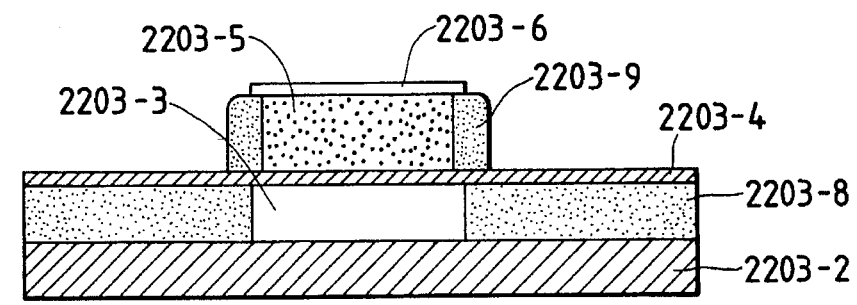

After the resist 2203-7 was removed with leaving the $Si_3N_4$ film 2203-6, side oxidation of the silicon of 2500 Å was effected to form a side wall 2203-9. As the same time, the impurities was diffused and activated (FIG. 22D).

Figure 22E:
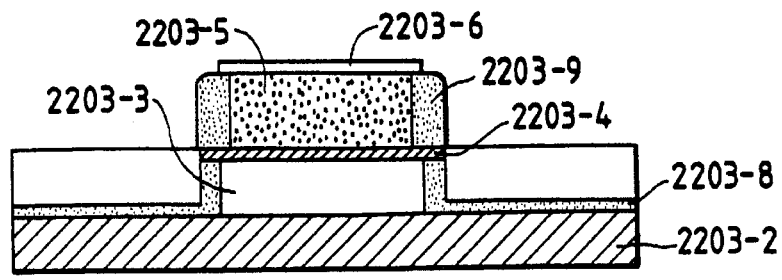

The oxide film 2203-4 and the silicon layer 2203-8 in the source and drain regions were dry etched by using as a mask the $Si_3N_4$ film 2203-6. At this etching, the silicon layer was incompletely etched with leaving only a small portion (about 50 Å) thereof (FIG. 22E).

Figure 22F:
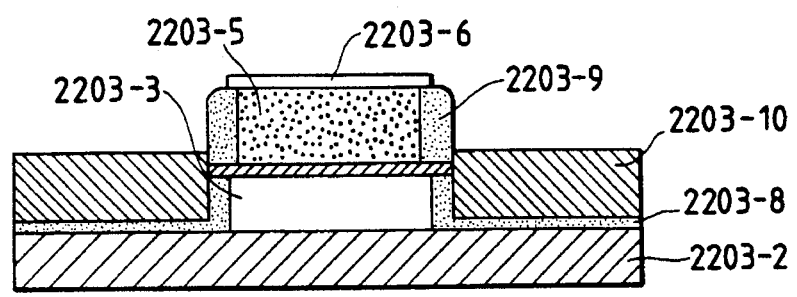

Al—Si 2203-10 was selectively deposited to about 500 Å by a lamp overheating method under a gas mixture containing monomethylaluminum as a raw material gas and $H_2$ gas as reaction gas at a substrate surface temperature of 350° C. to form a metal electrode for the source and drain regions only on the silicon portion 2203-8 which was exposed to the source and drain regions. The deposited portion comprised a silicon material, and the non-deposited portion comprised a silicon oxide film and a silicon nitride film. As a result, the metal electrodes 2203-10 for the source and drain were placed within a diffusion length $L_d$ of about 1 μm from the depletion edges of the PN junctions (FIG. 22F).

Figure 22G:
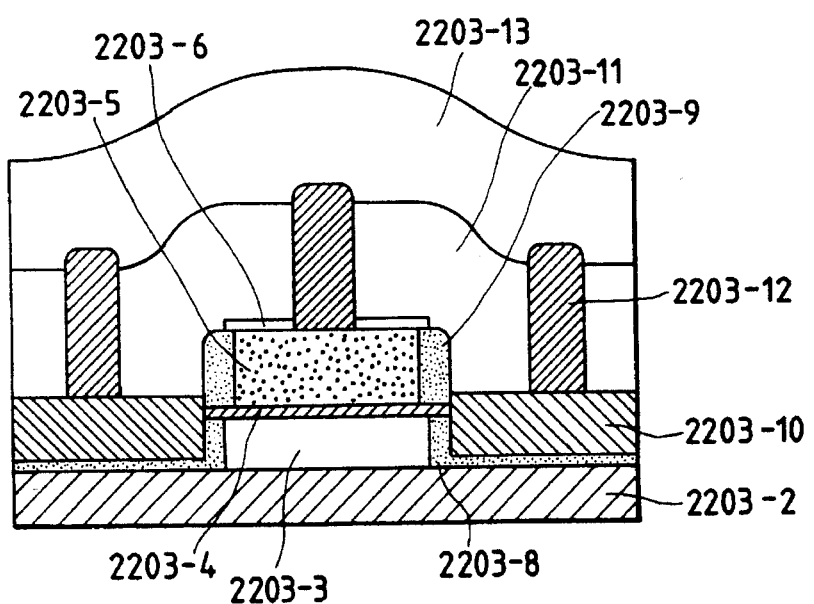

PSG (phosphorous glass) was then deposited to 6000 Å by the CVD process to form an interlayer insulating film 2203-11. Wiring Al—Si 2203-12 was deposited by the sputtering process. PSG was finally deposited to 8000 Å to form a protection film 2203-13, followed by heat treatment at 400° C. for 30 minutes (FIG. 22G).

It was confirmed by sectional SEM (Scanning Electron Microscope) that the metal electrode 2203-10 in the source and drain portions was extended to the ground insulating film 2203-2 by subsequent heat treatment or the like.

The transistor according to this embodiment shown in FIG. 21A was produced by the above-described method.

FIG. 21B is a drawing showing the energy band of the transistor of this embodiment. In the drawing, character A denotes heterojunction faces, and character B denotes PN junction faces, high-concentration impurity regions being held between the junction faces A and B. The metal electrode 2203-10 is present from a turn at the face A where no forbidden band region such as a semiconductor region is present.

FIG. 23 is a drawing showing the device characteristics of this embodiment.

FIG. 23A is a drawing showing the Id-Vg characteristics in which reference numeral 2304-1 shows this embodiment, and reference numeral 2304-2 shows a comparative example of thin film SOI-MOS transistors. In this embodiment, since the metal electrodes in the source and drain regions are extremely close to the source-channel junction edges, as compared with the source-drain electrodes in a conventional transistor, the parasitic resistance is very low, and a good linearity is thus obtained. The driving force (the slopes of the courves shown in the drawing) is increased about twice.

FIG. 23B is a drawing showing the dependency of the driving force to the gate length. In the drawing, curve 2304-3 shows the results of this embodiment, and curve 2304-4 shows the results of a thin film SOI-MOS transistor used for comparison. The comparative example shows a deviation from the ideal line (the one-dot chain line shown in the drawing) as the gate length decreases. This represents that the parasitic resistance in the source and drain portions becomes significant, as compared with the on resistance. While the transistor of this embodiment shows the dependency along the ideal line up to a gate length of about 0.8 μm. This shows that the parasitic resistance is sufficiently low.

FIG. 23C is a drawing showing the Id-Vg characteristics. In the drawing, curve 2304-5 shows the results of this embodiment, and curve 2304-6 shows the results of a thin film SOI-MOS transistor used for comparison.

FIG. 23D is a drawing showing the relation of the distance between the metal electrode of the source region and a source-channel PN junction to the source-drain endurance voltage. As shown in the drawing, the source-drain endurance voltage of this embodiment is 20 V or more and is significantly improved, as compared with the conventional transistor.

Embodiment 9

A ninth embodiment of the present invention is described below with reference to FIG. 24.

Figure 24A:
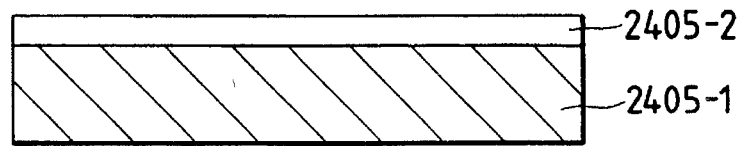
FIGS. 24A to 24H are schematic sectional views for explaining the process of producing a transistor according to Embodiment 9.

As shown in FIG. 24A, polycrystalline silicon was deposited on a quartz substrate 2405-1, and the polycrystalline silicon film formed was molten and solidified by applying an laser thereto to form a single crystal layer 2405-2. As a result, a SOI substrate having a semiconductor layer with a thickness of 500 Å was formed (FIG. 24A).

Figure 24B:
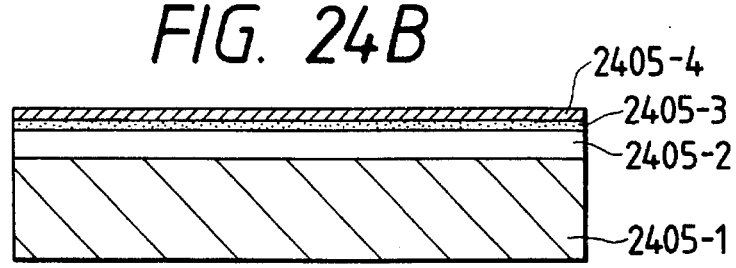

A silicon oxide film 2405-3 having a thickness of 300 Å was then formed on the substrate by the thermal oxidation method, and $Si_3N_4$ 2405-4 was deposited to 200 Å on the oxide film 2405-3 by the LP-CVD process to form a two-layer gate insulating film (FIG. 24B).

Figure 24C:
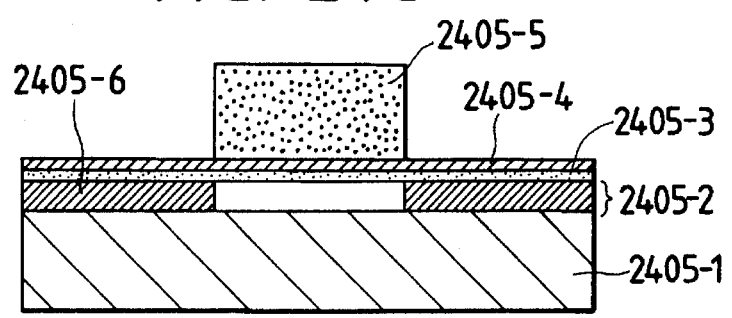

Polycrystalline silicon was then deposited to 5000 Å by the LP-CVD process to form a gate electrode 2405-5. Phosphorous ($P^{31}$) ions were then injected into the source and drain regions 2405-3 by using as a mask material the gate electrode 2405-5 with a dose of 1E+15/cm² (=$10^{15}$/cm²) and an injection energy of 60 KeV (FIG. 24C).

Figure 24D:
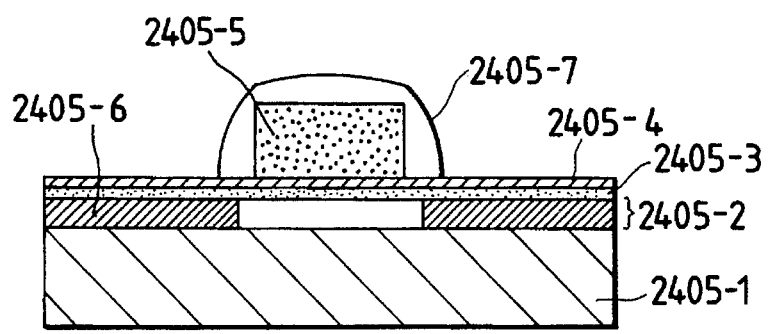

After the source and drain regions 2405-3 was formed, the polycrystalline silicon which formed the gate electrode 2405-5 was oxidized to deposite a CVD silicon oxide film thereon, and the spacer (side wall) 2405-7 shown in FIG. 24D was formed by anisotropic etching (FIG. 24D).

Figure 24E:
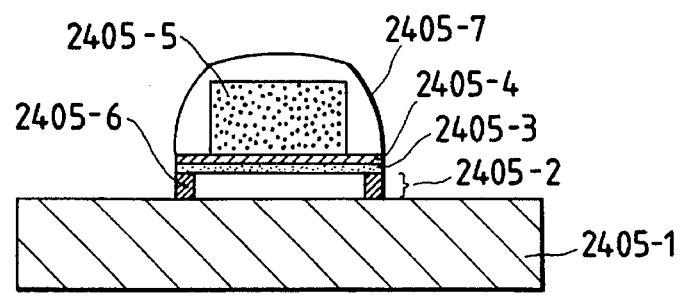

The spacer 2405-7 was then subjected to dry etching so as to have the sectional structure shown in FIG. 24E.

Figure 24F:
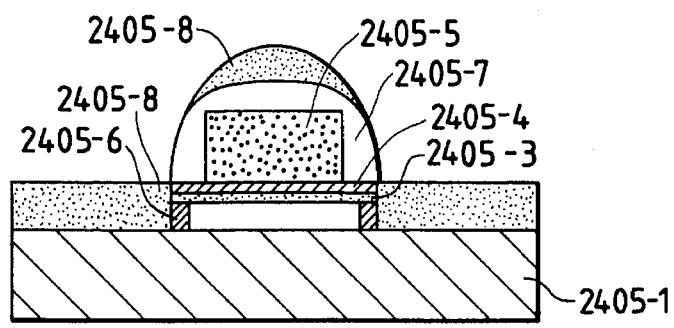

WSi (tungsten silicide) 2405-8 was then deposited over the whole surface by the sputtering process (FIG. 24F).

Figure 24G:
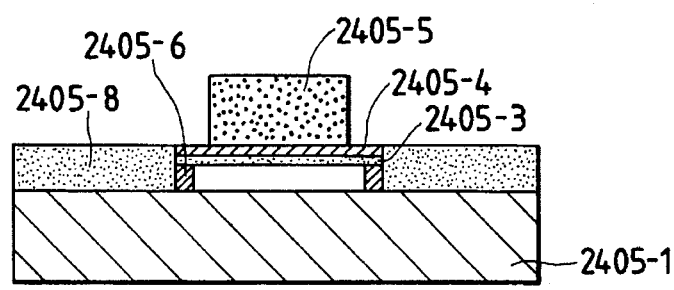

The WSi was then lifted off by the silicon oxide film by a wet etching process using a hydrofluoric acid etching solution (FIG. 24G).

Figure 24H:
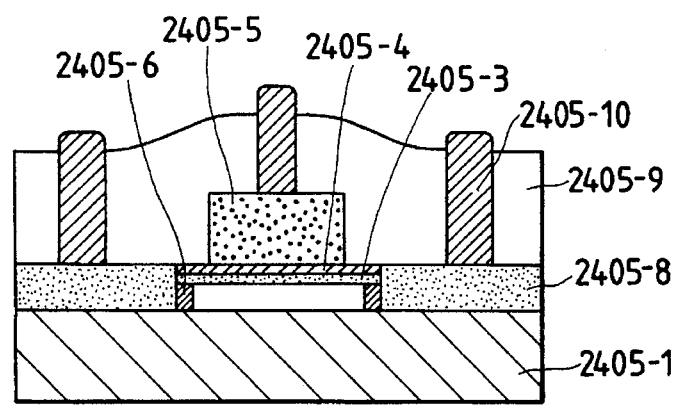

An inter layer insulating film 2405-9, metal wiring (WSi) 2405-10 and a protective film were then formed by the same method as that employed in the seventh embodiment. As a result, a MOS transistor having metal electrodes 2405-8 which were provided within the diffusion length $L_d$ from the PN junction faces and which were extended to the quartz substrate 2405-1 having the ground insulating film was formed (FIG. 24H).

As a result of comprison of the transistor of this embodiment with a comparative thin film SOI-MOS transistor, the SOI-MOS transistor of this embodiment showed no kink phenomenon and had a source-drain endurance voltage of 20 V or more and the Id-Vg characteristics with good linearity.

Embodiment 10

A tenth embodiment of the present invention is described below with reference to FIG. 25.

Figure 25A:
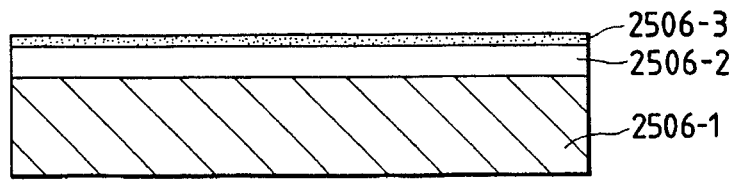
FIGS. 25A to 25G are schematic sectional views for explaining the process of producing Example 10.

As shown in FIG. 25A, polycrystalline silicon was deposited on a quartz substrate 2506-1 by the LP-CVD process and then molten and recrystallized by applying an eximer laser thereto to form a semiconductor silicon layer 2506-2. The thickness of the semiconductor layer was adjusted by sacrifice oxidation. A SOI substrate having the semiconductor silicon layer 2506-2 having a thickness of 500 Å was thus formed. 200 Å gate oxide film 2506-3 having a thickness of 200 Å was then formed by the thermal oxidation method (FIG. 25A).

Figure 25B:
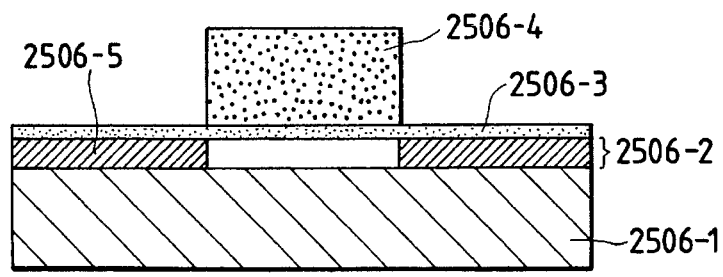

A polycrystalline silicon film was then deposited to 4000 Å by the LP-CVD process to form a gate electrode 2506-4, and impurities were introduced into source and drain regions 2506-5 by ion implantation using as a mask the gate electrode 2506-4 (FIG. 25B).

Figure 25C:
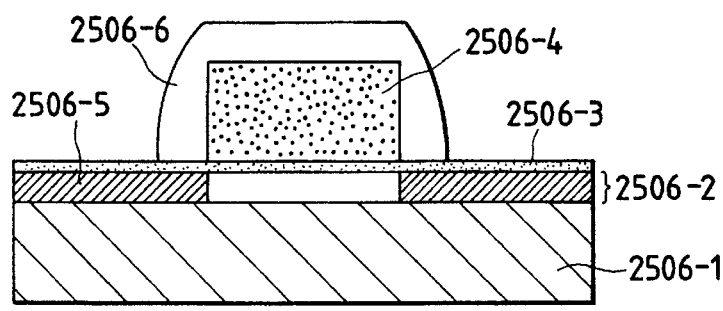

The polycrystalline silicon which formed the gate electrode 2506-4 was then thermally oxidized to form a polycrystalline silicon oxide film 2506-6 having a thickness of 2000 Å (FIG. 25C).

Figure 25D:
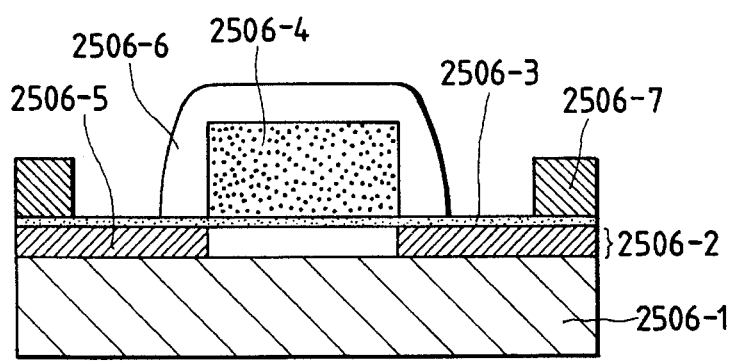

A resist 2506-7 was then applied for forming contact holes, as shown in FIG. 25D (FIG. 25D).

Figure 25E:
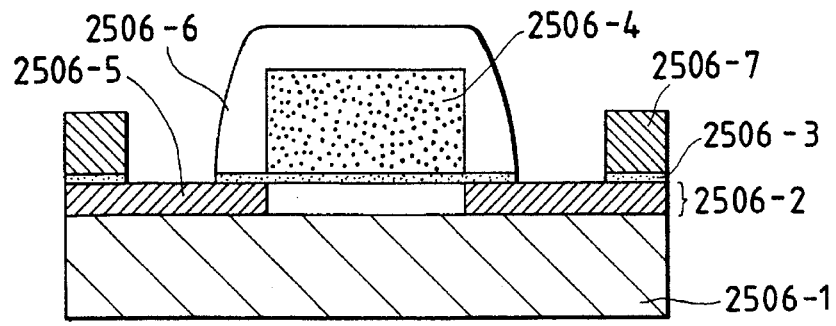

The contact holes were formed with self alignment. In this formation, the contact holes could be formed with self alignment without being short-circuited with the gate electrode by etching the oxide film in an amount of 400 Å (FIG. 25E).

Figure 25F:
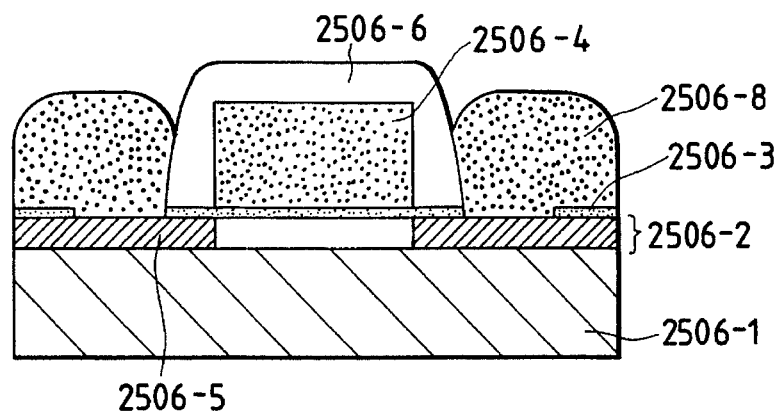

As shown in FIG. 25F, aluminum was then deposited by the sputtering process of form source-drain metal electrodes 2506-8 and subjected to heat treatment at 470° C.

Figure 25G:
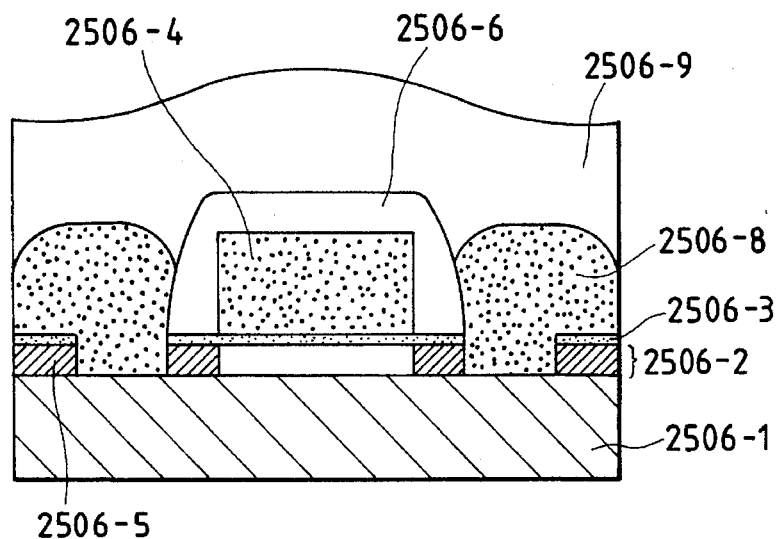

As a result, the device had the sectional structure shown in FIG. 25G in which the aluminum of the metal electrode 2506-8 was extended to the quartz substrate having the ground insulating film 2506-1. In this embodiment, the important points were the following:

(1) Al is used as the source-drain metal electrode 2506-8 without using AlSi.

(2) The temperature of the heat treatment after the deposition-of the Al electrode 2506-8 is 470° C.

These points purposely produces an Al spike phenomenon.

As a result, the source-drain metal electrodes 2506-8 are disposed within the diffusion length of 1 μm from the source-channel PN junction faces, and the metal electrodes 2506-8 are extended to the ground quartz substrate 2506-1. A PSG film was then deposited to 8000 Å to form a protective film.

A recrystallized silicon thin film SOI-MOS transistor was formed by the same method as that employed in this embodiment with the exception that a metal electrode was formed of AlSi, and the temperature of heat treatment after the metal electrode was deposited was 400° C. and compared with the transistor of this embodiment. As a result, it was found that the transistor of this embodiment has an improved endurance voltage and Id-Vg characteristics with a good linear region.

As described above, in the present invention, since the energy band gap $Eg_2$ in the source portion is set to a value different from the energy band gap $Eg_1$ in the channel portion, holes are smoothly moved between the source and channel, and good saturation properties and a high source-drain endurance voltage can be obtained.

In addition, in a thin film SOI-MIS transistor having heterojunctions in the source and drain regions, the heterojunction faces are provided within the diffusion length $L_d$ from the depletion edges of the source-channel PN junctions, thereby obtaining the effects of improving the resistance to the kink phenomenon and the source-drain endurance voltage and decreasing the dark current.

The MIS transistor of the present invention produces no phenomenon that the dark current is increased due to the generation of the current from defects which serve as generation sources or paths (for example, hopping current), as in a conventional transistor in which the source-channel PN junctions are heterojunctions, or heterojunctions are included in the depletion layers of the PN junctions.

Further, a thin film SOI-MIS transistor formed by using as a semiconductor material a mixed crystal of silicon and germanium and having a heterojunction provided at least in a source region is characterized by the following:

(1) The μmixed crystal rate y of the channel portion ($Si_yGe_{1-y}$) is greater than the mixed crystal rate x of the source and drain portions ($Si_xGe_{1-x}$), the mixed crystal rate x satisfying the condition that $x \leq 0.12$;

(2) The $Si_xGe_{1-x}$ heterojunction face of the source portion is provided within the diffusion length Ld from the depletion edge of the source-channel PN junction on the source side.

There are thus the effects of decreasing the parasitic resistance of the source and drain regions and increasing the driving force Gm with preventing the deterioration thereof even in a MOS transistor formed on a thin film SOI substrate having a thickness of as small as 500 Å.

The invention also has the effects of preventing the kink phenomenon and increasing the source-drain endurance voltage.

Further, in a thin film SOI-MIS transistor, a metal electrode of a source portion is provided within the diffusion length $L_d$ from the source-side depletion edge of the source-channel PN junction and is extended to the ground insulating film, thereby improving the resistance to the kink phenomenon and the source-drain endurance voltage, significantly decreasing the parasitic resistance of the source and drain portions and preventing the deterioration in the driving force.

Although each of the embodiment uses a SIMOX substrate, SOI substrates which can be formed by other methods can of course be used.

What is claimed is:

1. An MIS transistor comprising a channel region of a first conductivity type of a first semiconductor material formed on an insulating substrate, second conductivity type source and drain regions sandwiching said channel region therebetween, and a gate electrode formed on a main surface of said channel region with an insulating film therebetween, wherein:

said source region is made of said first semiconductor material and a second semiconductor material having an energy band gap narrower than that of said first semiconductor material; and a heterojunction between said first and second semiconductor materials is provided outside of a depletion region formed from a junction between said source and channel regions, and inside a diffusion length $L_d$ from a depletion edge of said depletion region.

2. An MIS transistor according to claim 1, wherein said depletion edge is substantially placed away from the junction between said source and channel regions.

3. An MIS transistor according to claim 1, wherein said first semiconductor material is silicon (Si), and said second semiconductor material is a mixed crystal (SiGe) of silicon and germanium.

4. An MIS transistor according to claim 1, wherein said first and second semiconductor materials are compound semiconductors.

5. An MIS transistor according to claim 4, wherein said compound semiconductor used as said first semiconductor material is $GaAs_{1-x}Sb_x$, and said compound semiconductor used as said second semiconductor material is $GaAs_{1-y}Sb_y$ [(x<y)], wherein said x and y satisfy the condition that x<y.

6. An MIS transistor comprising a channel region of a first conductivity type semiconductor formed on an insulating substrate, source and drain regions of a second conductivity type semiconductor sandwiching said channel region therebetween, and a gate electrode formed on a main surface of said channel region with an insulating film therebetween, wherein:

at least said source region has a heterojunction separated from a PN junction between said source and channel regions, and said source region contains a mixed crystal ($Si_xGe_{1-x}$) region composed of silicon with a mixed crystal rate x and germanium, and said channel region only contains a mixed crystal ($Si_yGe_{1-y}$) composed of silicon with a mixed crystal rate y and germanium, and said mixed crystal rates x and y satisfy the conditions that x<y.

7. An MIS transistor according to claim 6, wherein said heterojunction is not included in a depletion region formed from said PN junction and is provided within a diffusion length $L_d$ from a depletion edge of said depletion region.

8. An MIS transistor comprising a channel region formed on an insulating substrate and having a first conductivity type semiconductor, source and drain regions formed on said insulating substrate with said channel region therebetween and having a second conductivity type semiconductor, and a gate electrode formed on a main surface of said channel region with an insulating film therebetween, wherein:

at least a metal electrode of said source region among the metal electrodes formed in said source and drain regions is present outside the depletion region of a PN junction between said channel and source regions and inside a diffusion length $L_d$ from a depletion edge of said depletion region, wherein $L_d$O.

9. An MIS transistor according to claim 8, wherein said metal electrode of said source region is extended to said insulating substrate.

10. An MIS transistor comprising a first conductivity type semiconductor layer having a channel region, second conductivity type source and drain impurity regions sandwiching said channel region, and a gate electrode provided on said channel region sandwiching a gate insulating film therebetween, wherein;

said channel region comprises a first semiconductor material of a first energy band gap, and said source region comprises only the first semiconductor material and a second semiconductor material of a second energy band gap, and a position of a heterojunction between the first and second semiconductor materials of said source region is separated from a PN junction between the first semiconductor layer of said channel region and the second conductivity type source region.

11. An MIS transistor according to claim 10, wherein the energy band gap of the first semiconductor material is wider than that of the second semiconductor material.

* * * * *

UNITED STATES PATENT AND TRADEMARK OFFICE
CERTIFICATE OF CORRECTION

PATENT NO. : 5,475,244

DATED : December 12, 1995

INVENTORS : TORU KOIZUMI ET AL.

It is certified that error appears in the above-identified patent and that said Letters Patent is hereby corrected as shown below:

<u>ON TITLE PAGE</u>

In [54] "TITLE" should read --AN MIS TRANSISTOR HAVING SECOND CONDUCTIVITY TYPE SOURCE AND DRAIN REGIONS SANDWICHING A CHANNEL REGION OF A FIRST CONDUCTIVITY TYPE OF A FIRST SEMICONDUCTOR MATERIAL FORMED ON AN INSULATING SUBSTRATE, AND A GATE ELECTRODE FORMED ON A MAIN SURFACE OF THE CHANNEL REGION--.

In [56] References Cited, under OTHER PUBLICATIONS:
"Pat. Abs." should read --¶ Pat. Abs.--

<u>COLUMN 1</u>

Lines 1-7, Title --AN MIS TRANSISTOR HAVING SECOND CONDUCTIVITY TYPE SOURCE AND DRAIN REGIONS SANDWICHING A

UNITED STATES PATENT AND TRADEMARK OFFICE
CERTIFICATE OF CORRECTION

PATENT NO. : 5,475,244

DATED : December 12, 1995

INVENTOR(S): TORU KOIZUMI ET AL.

It is certified that error appears in the above-identified patent and that said Letters Patent is hereby corrected as shown below:

CHANNEL REGION OF A FIRST CONDUCTIVITY TYPE OF A FIRST SEMICONDUCTOR MATERIAL FORMED ON AN INSULATING SUBSTRATE, AND A GATE ELECTRODE FORMED ON A MAIN SURFACE OF THE CHANNEL REGION--.

IN THE DRAWINGS

Sheet 26 of 32: Fig. 23D "SOURE" should read --SOURCE--.

COLUMN 2

Line 34, "controlled" should read --controlling--.

Line 65, "the" should read --of the--.

COLUMN 3

Line 11, "is" should read --is a--.

Line 22, "view" should read --views--.

Line 24, "the" should read --of the--.

UNITED STATES PATENT AND TRADEMARK OFFICE
CERTIFICATE OF CORRECTION

PATENT NO. : 5,475,244
DATED : December 12, 1995
INVENTORS : TORU KOIZUMI ET AL.

It is certified that error appears in the above-identified patent and that said Letters Patent is hereby corrected as shown below:

COLUMN 4

Line 28, "prises" should read --prise--.

Line 58, "oh" should read --on--.

Line 61, "semiconductor" should read --semiconductor,--.

COLUMN 5

Line 41, "a energy" should read --an energy--.

COLUMN 6

Line 55, "decreased" should read --decreased,--.

COLUMN 7

Line 43, "heterojucn-" should read --heterojunc---.

UNITED STATES PATENT AND TRADEMARK OFFICE
CERTIFICATE OF CORRECTION

PATENT NO. : 5,475,244

DATED : December 12, 1995

INVENTOR(S): TORU KOIZUMI ET AL.

It is certified that error appears in the above-identified patent and that said Letters Patent is hereby corrected as shown below:

COLUMN 8

Line 18, "tan" should read --an--.

Line 55, "$10^{19}$" should read --$10^{19}cm^{-3}$--.

COLUMN 11

Line 22, "gorund" should read --ground--.

Line 26, "$SiMO_x$ substrate" should read --SIMOX substrate--.

Line 56, "an" should be deleted.

Line 59, "thickness." should read --thickness--.

COLUMN 14

Line 51, "prodcution" should read --production--.

UNITED STATES PATENT AND TRADEMARK OFFICE
CERTIFICATE OF CORRECTION

PATENT NO. : 5,475,244

DATED : December 12, 1995

INVENTOR(S): TORU KOIZUMI ET AL.

It is certified that error appears in the above-identified patent and that said Letters Patent is hereby corrected as shown below:

COLUMN 18

Line 13, "a a" should read --a--.

COLUMN 19

Line 20, "courves" should read --curves--.

Line 52, "an" should read --a--.

COLUMN 20

Line 21, "comprison" should read --comparison--.

UNITED STATES PATENT AND TRADEMARK OFFICE
CERTIFICATE OF CORRECTION

PATENT NO. : 5,475,244

DATED : December 12, 1995

INVENTOR(S) : TORU KOIZUMI ET AL.

It is certified that error appears in the above-identified patent and that said Letters Patent is hereby corrected as shown below:

COLUMN 21

Line 50, "µmixed" should read --mixed--.

COLUMN 22

Line 10, "embodiment" should read --embodiments--.

Signed and Sealed this

Fourth Day of June, 1996

Attest:

BRUCE LEHMAN

Attesting Officer

Commissioner of Patents and Trademarks